United States Patent
Xu et al.

(10) Patent No.: US 12,042,901 B2
(45) Date of Patent: Jul. 23, 2024

(54) CLEANING LIQUID SUPPLY DEVICE, CLEANING UNIT, AND STORAGE MEDIUM STORING PROGRAM

(71) Applicant: EBARA CORPORATION, Tokyo (JP)

(72) Inventors: Haiyang Xu, Tokyo (JP); Fujihiko Toyomasu, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 17/740,190

(22) Filed: May 9, 2022

(65) Prior Publication Data

US 2022/0266417 A1 Aug. 25, 2022

Related U.S. Application Data

(62) Division of application No. 16/470,096, filed as application No. PCT/JP2017/044843 on Dec. 14, 2017, now Pat. No. 11,358,253.

(30) Foreign Application Priority Data

Dec. 16, 2016 (JP) .................................. 2016-244469
Dec. 11, 2017 (JP) .................................. 2017-236998

(51) Int. Cl.
 *B24B 37/34* (2012.01)
 *B08B 3/08* (2006.01)
 (Continued)

(52) U.S. Cl.
 CPC ............... *B24B 37/34* (2013.01); *B08B 3/08* (2013.01); *G01F 1/66* (2013.01); *H01L 21/6704* (2013.01);
 (Continued)

(58) Field of Classification Search
 CPC .. B24B 37/34; B08B 3/00; B08B 3/08; G01F 1/66; G01F 1/36; H01L 21/6704; H01L 21/30625
 (Continued)

(56) References Cited

U.S. PATENT DOCUMENTS 4,545,244 A 10/1985 Yasuda et al.
2004/0031503 A1 2/2004 Eitoku
(Continued)

FOREIGN PATENT DOCUMENTS

JP H09-260332 A 10/1997
JP 2000-124186 A 4/2000
(Continued)

OTHER PUBLICATIONS

JP2016009818A—machine translation (Year: 2016).*
(Continued)

*Primary Examiner* — Tinsae B Ayalew
(74) *Attorney, Agent, or Firm* — BakerHostetler

(57) ABSTRACT

A cleaning liquid supply device for supplying a cleaning device with cleaning liquid includes a chemical liquid inlet portion and a dilution water inlet portion, a first chemical liquid control unit fluidically connected to the chemical liquid inlet portion and the dilution water inlet portion, and a second chemical liquid control unit fluidically connected to the chemical liquid inlet portion and the dilution water inlet portion. The first chemical liquid control unit includes a first chemical-liquid-flow-rate control unit, a first dilution-water-flow-rate control unit, and a first mixing portion. The second chemical liquid control unit includes a second chemical-liquid-flow-rate control unit, a second dilution-water-flow-rate control unit, and a second mixing portion.

12 Claims, 13 Drawing Sheets

(51) Int. Cl.
*G01F 1/66* (2022.01)
*H01L 21/67* (2006.01)
*B08B 3/00* (2006.01)
*G01F 1/36* (2006.01)
*H01L 21/306* (2006.01)

(52) U.S. Cl.
CPC ............... *B08B 3/00* (2013.01); *G01F 1/36* (2013.01); *H01L 21/30625* (2013.01)

(58) Field of Classification Search
USPC ....................................................... 134/56 R
See application file for complete search history.

(56) References Cited

U.S. PATENT DOCUMENTS

| | | |
|---|---|---|
| 2011/0209560 A1 | 9/2011 | Ito et al. |
| 2014/0158159 A1 | 6/2014 | Ishibashi |
| 2015/0357208 A1 | 12/2015 | Toyomasu et al. |

FOREIGN PATENT DOCUMENTS

| | | |
|---|---|---|
| JP | 2002-277300 A | 9/2002 |
| JP | 2011-199256 A | 10/2011 |
| JP | 2013-059735 A | 4/2013 |
| JP | 2014-132641 A | 7/2014 |
| JP | 2016-009818 A | 1/2016 |
| JP | 2016-015469 A | 1/2016 |

OTHER PUBLICATIONS

JP2002277300A—machine translation (Year: 2002).*
International Patent Application No. PCT/JP2017/044843; Int'l Search Report; dated Mar. 6, 2018; 7 pages.
International Patent Application No. PCT/JP2017/044843; Int'l Written Opinion; dated Mar. 6, 2018; 14 pages.

* cited by examiner

CLEANING LIQUID SUPPLY DEVICE, CLEANING UNIT, AND STORAGE MEDIUM STORING PROGRAM

CROSS-REFERENCE TO RELATED APPLICATIONS

This application is a divisional of U.S. patent application Ser. No. 16/470,096, filed Jun. 14, 2019, which is a U.S. National Stage Entry of PCT/JP2017/044843, filed Dec. 14, 2017; which claims priority to JP Application No. 2017-236998 filed Dec. 11, 2017; and JP Application No. 2016-244469 filed Dec. 16, 2016; the contents of each of which are incorporated herein by reference in their entirety.

TECHNICAL FIELD

The present invention relates to a cleaning liquid supply device, a cleaning unit, and a storage medium storing a program.

BACKGROUND ART

A Chemical Mechanical Polishing (CMP) device includes a polishing unit for polishing a surface of a semiconductor substrate on which a semiconductor chip is formed and a cleaning unit for cleaning the semiconductor substrate polished at the polishing unit while supplying the semiconductor substrate with chemical liquid. This cleaning unit mixes the chemical liquid with a dilution water such as a De-Ionized Water (DIW) to make chemical liquid whose concentration is adjusted, thus cleaning the semiconductor substrate using the chemical liquid.

Patent Literature 1 discloses a cleaning liquid supply device of a substrate processing device. This cleaning liquid supply device includes a processing tank 2 that accumulates a process liquid to process a substrate and a cleaning liquid tank 3 that stores cleaning liquid to be supplied to the processing tank 2. The adjustment of a flow rate of the cleaning chemical liquid when supplying such liquid to the substrate can be implemented by disposing a resistance portion 6 as a throttle on the middle of a pipe 4 from the cleaning liquid tank 3 to the processing tank 2.

Patent Literature 2 discloses a cleaning device that performs scrub cleaning on a surface of a substrate with a roll cleaning member. In this cleaning device, cleaning liquid and a De-Ionized Water (DIW) supplied with different flow passages are supplied to a substrate surface from different nozzles.

Patent Literature 3 discloses a cleaning unit that includes a cleaning device and a cleaning liquid supply device. In this cleaning unit, a DIW CLC 111 and a chemical liquid CLC 113 adjust respective flow rates of a DIW and cleaning liquid, a mixer 115 mixes the DIW with the chemical liquid after the adjustment, and then, the mixer 115 supplies an upper surface cleaning portion 222 and a lower surface cleaning portion 223 of a cleaning device 200 with the chemical liquid after dilution.

Patent Literature 4 discloses a cleaning unit that includes a cleaning device and a cleaning liquid supply device. In this cleaning unit, when first chemical liquid are supplied to a cleaning device 200, a DIW CLC 110 and a chemical liquid CLC 120 adjust respective flow rates of a DIW and chemical liquid, a mixer 72 mixes the DIW with the chemical liquid after the adjustment, and then, the chemical liquid after dilution are supplied to the cleaning device 200. Meanwhile, when second chemical liquid are supplied to the cleaning device 200, the DIW CLC 110 and a chemical liquid CLC 130 adjust respective flow rates of the DIW and the chemical liquid, a mixer 73 mixes the DIW with the chemical liquid after the adjustment, and then, the chemical liquid after dilution are supplied to the cleaning device 200.

CITATION LIST—PATENT LITERATURE

Patent Literature 1: Japanese Patent Application Publication No. 9-260332
Patent Literature 2: Japanese Patent Application Publication No. 2014-132641
Patent Literature 3: Japanese Patent Application Publication No. 2016-9818
Patent Literature 4: Japanese Patent Application Publication No. 2016-15469

SUMMARY OF INVENTION

In the configurations described in Patent Literatures 1 to 4, flow rates and concentrations of chemical liquid supplied to respective surfaces (for example, an upper surface and a lower surface) of a substrate cannot be independently controlled.

When the chemical liquid are supplied to only any one of the respective surfaces of the substrate with the conventional configuration of cleaning liquid supply device exemplified in Patent Literature 1-4, it is necessary to dispose open/close valves on the respective flow passages in a cleaning device to control flow and cutoff of the chemical liquid through each flow passage.

Recently, an alternative configuration of cleaning liquid supply device in which the chemical liquid and/or the DIW are supplied from a common supply source to a plurality of processing devices of semiconductor substrate in a plant has been studied. In the cleaning liquid supply device having such configuration, there is a possibility of lack of a pressure of the chemical liquid and/or the DIW to be supplied to a cleaning liquid supply device, depending on an installation site of the device. Thus, when the supply pressure of the chemical liquid and/or the DIW to the cleaning liquid supply device is low, the cleaning liquid supply device and the cleaning device, which have a pressure loss in their flow passages and their conventional configurations, possibly cannot supply the substrate with the chemical liquid having a sufficient flow rate.

For example, in the conventional cleaning unit, when the chemical liquid and/or the DIW are supplied to the respective surfaces of the substrate, the respective flow passages are branched from the common flow passage to sides of the respective surfaces of the substrate, and the throttle is disposed on one flow passage to adjust the flow rate. When the supply pressure of the chemical liquid and/or the DIW to the cleaning liquid supply device is low, the pressure loss at a throttle part possibly cannot supply the substrate with the chemical liquid having the sufficient flow rate.

An object of the present invention is to solve at least a part of the above-described problems.

According to one aspect of the present invention, a device for supplying a cleaning device with chemical liquid for cleaning is provided. The device includes a chemical liquid inlet portion and a dilution water inlet portion, a first chemical liquid control unit fluidically connected to the chemical liquid inlet portion and the dilution water inlet portion, and a second chemical liquid control unit fluidically connected to the chemical liquid inlet portion and the dilution water inlet portion. The first chemical liquid control unit includes a first chemical-liquid-flow-rate control unit configured to receive a supply of chemical liquid from the chemical liquid inlet portion to control a flow rate of the chemical liquid, a first dilution-water-flow-rate control unit configured to receive a supply of a dilution water from the dilution water inlet portion to control a flow rate of the dilution water, and a first mixing portion that mixes the chemical liquid and the dilution water from the first chemical-liquid-flow-rate control unit and the first dilution-water-flow-rate control unit. The second chemical-liquid control unit includes a second chemical-liquid-flow-rate control unit configured to receive a supply of the chemical liquid from the chemical liquid inlet portion to control a flow rate of the chemical liquid, a second dilution-water-flow-rate control unit configured to receive a supply of the dilution water from the dilution water inlet portion to control a flow rate of the dilution water, and a second mixing portion configured to mix the chemical liquid and the dilution water from the second chemical-liquid-flow-rate control unit and the second dilution-water-flow-rate control unit.

According to one aspect of the present invention, a device for supplying a cleaning device with chemical liquid for cleaning is provided. The device includes a flowmeter, a first pipe that enters into the flowmeter, and a second pipe that exits from the flowmeter. The first pipe and the second pipe are inclined from a horizontal direction and a vertical direction.

DESCRIPTION OF EMBODIMENTS

Figure 1:
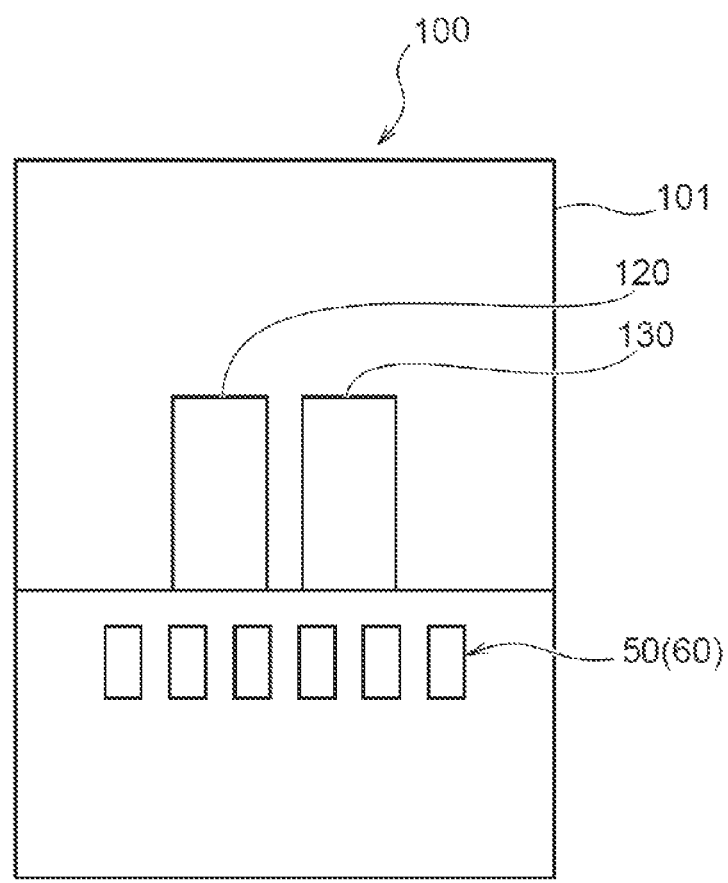
FIG. 1 is a schematic front view illustrating a cleaning liquid supply device according to one embodiment.

The following describes one embodiment of the present invention with reference to the drawings. FIG. 1 is a schematic front view illustrating a cleaning liquid supply device according to the one embodiment of the present invention. A cleaning liquid supply device 100 in this embodiment is configured to supply a cleaning device 200 included in a substrate processing device with chemical liquid (for example, hydrofluoric acid and ammonia solution) for cleaning. The substrate processing device includes, for example, a polishing device such as a Chemical Mechanical Polishing (CMP) device.

As illustrated in FIG. 1, the cleaning liquid supply device 100 according to the one embodiment includes a case 101, a first chemical liquid dilution box (a first chemical liquid control unit) 120, a second chemical liquid dilution box (a second chemical liquid control unit) 130, and a plurality of chemical liquid utility boxes 50. The first chemical liquid dilution box 120, the second chemical liquid dilution box 130, and the plurality of chemical liquid utility boxes 50 are housed in the case 101. The first chemical liquid dilution box 120 and the second chemical liquid dilution box 130 mix chemical liquid with a dilution water to generate chemical liquid (chemical liquid after dilution) whose flow rate and concentration are adjusted. The dilution water is any dilution medium including a De-Ionized Water (DIW). In the following description, the dilution water is described as the DIW, but the dilution water may be a dilution medium other than the DIW. In the cleaning liquid supply device 100, the chemical liquid utility box 50 has a configuration to introduce the chemical liquid from a chemical liquid supply source 20 to the cleaning liquid supply device 100. In the example illustrated in the drawing, six chemical liquid utility boxes 50 are disposed in the cleaning liquid supply device 100, but this is one example. The number of chemical liquid utility boxes 50 is changed as necessary corresponding to a specification of the cleaning device 200.

Figure 2:
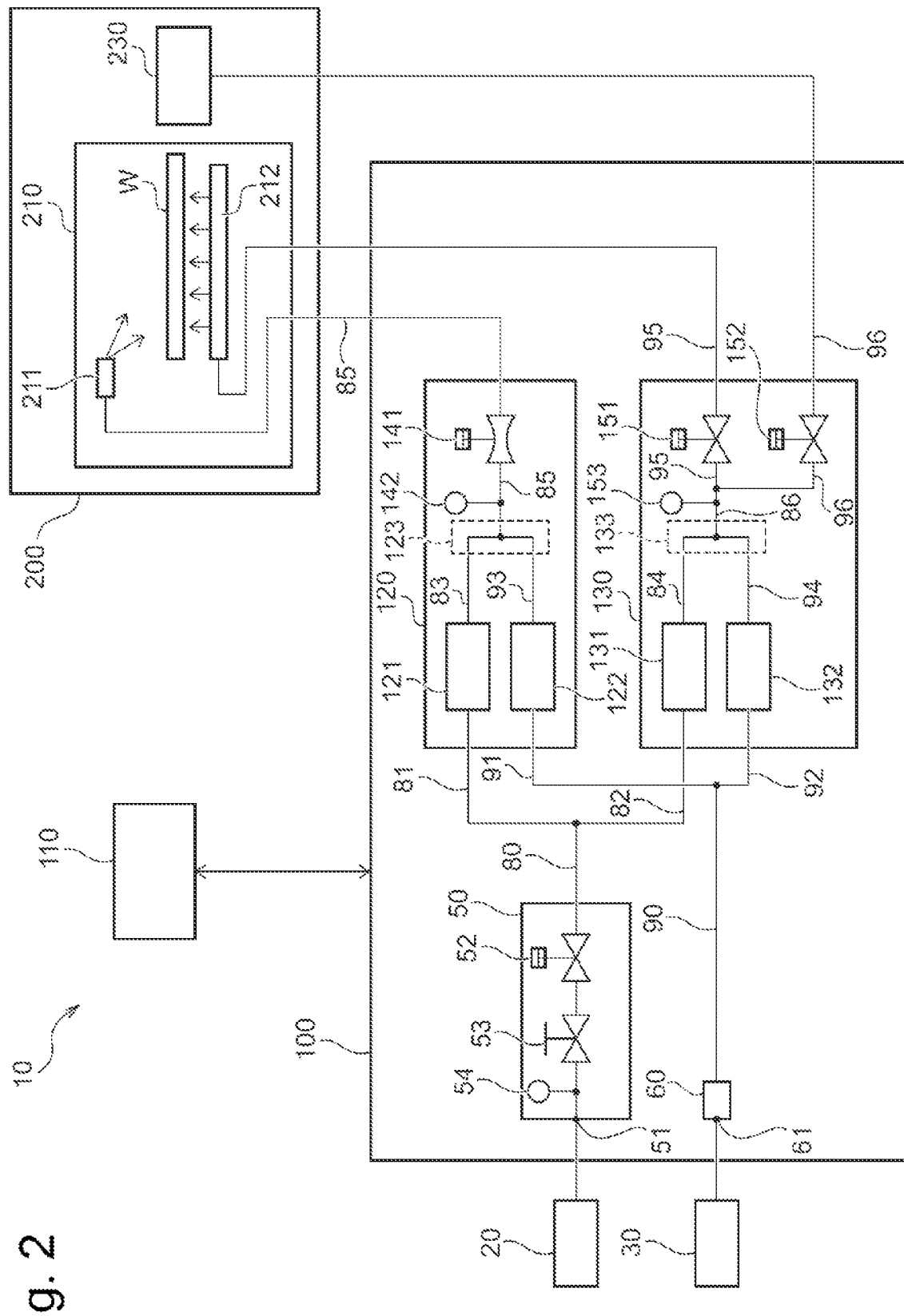
FIG. 2 is a fluid circuit diagram of a cleaning unit according to the one embodiment.

FIG. 2 is a fluid circuit diagram of a cleaning unit according to the one embodiment. A cleaning unit 10 includes the cleaning liquid supply device 100 and the cleaning device 200. In the cleaning liquid supply device 100, the chemical liquid utility box 50 includes an input portion 51 connected to the chemical liquid supply source 20 (see FIG. 2), an open/close valve 52, a lockout valve 53, and a pressure gauge 54. An open/close control is performed on the open/close valve 52 by a signal from a control device 110. The lockout valve 53, which is a valve manually opened and closed, is used, for example, when the chemical liquid supply source 20 is separated from the cleaning liquid supply device 100 in maintenance. The pressure gauge 54 detects a pressure of the chemical liquid introduced from the chemical liquid supply source 20 to the cleaning liquid supply device 100. In this example, the input portion 51 constitutes a chemical liquid inlet portion. When the chemical liquid utility box 50 is omitted, a connecting portion of the cleaning liquid supply device 100 to the chemical liquid supply source 20 constitutes the chemical liquid inlet portion.

The control device 110, for example, may be a control device disposed on the cleaning liquid supply device 100, may be a control device disposed on the cleaning unit 10, or may be a control device disposed on the substrate processing device such as the polishing device on which the cleaning unit 10 is disposed. The control device 110 includes a computer or a control circuit such as a microcomputer and a sequencer, and a storing medium (for example, a volatile or non-volatile memory) that stores a program executed in the control circuit. The program includes a program to perform a supply of the chemical liquid (the chemical liquid after dilution) and cleaning by the cleaning liquid supply device 100 and the cleaning device 200. Respective units of the cleaning liquid supply device 100 and the cleaning device 200 are controlled in accordance with this program. The above-described program may be stored in a storing medium (for example, a CD and a flash memory) attachable to/detachable from the control device 110. The above-described program may be stored in a storing medium readable by the control device 110 by wire or air.

The cleaning liquid supply device 100 further includes a regulator 60 to introduce the DIW from a DIW supply source 30 to the cleaning liquid supply device 100. The regulator 60 adjusts a pressure of the DIW from the DIW supply source 30 to output it to the first chemical liquid dilution box 120 and the second chemical liquid dilution box 130 via pipes 90, 91, and 92. In this example, an input portion 61 of the regulator 60 constitutes a dilution water inlet portion. When the regulator 60 is omitted, a connecting portion of the cleaning liquid supply device 100 to the DIW supply source 30 constitutes the dilution water inlet portion.

The first chemical liquid dilution box 120 controls respective flow rates of the chemical liquid and the DIW to output the chemical liquid (the chemical liquid after dilution) having desired flow rate and concentration. The first chemical liquid dilution box 120 includes an input portion connected to the chemical liquid utility box 50 via pipes 80 and 81 and connected to the regulator 60 via the pipes 90 and 91. The first chemical liquid dilution box 120 includes an output portion connected to a nozzle 211 of a cleaning portion 210 in the cleaning device 200 via a pipe 85.

Figure 3:
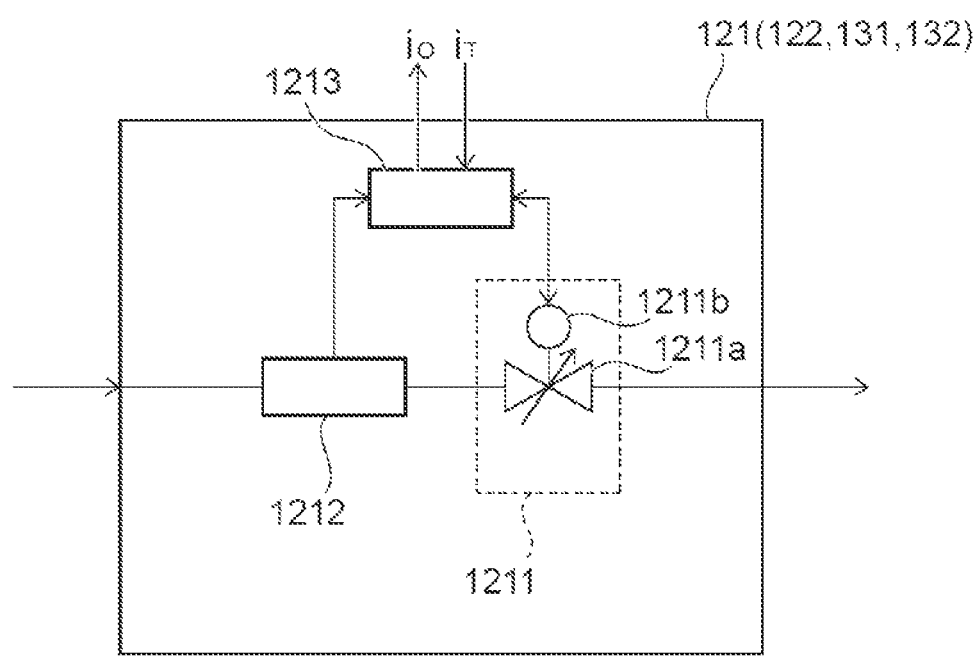
FIG. 3 is a block diagram illustrating a configuration of a flow rate control valve unit (CLC) according to the one embodiment.

The first chemical liquid dilution box 120 includes a first chemical liquid CLC (a first chemical liquid-flow-rate control unit) 121, a first DIW CLC (a first dilution-water-flow-rate control unit) 122, and a mixing portion 123. A Closed Loop Controller (CLC) is a flow rate control valve unit formed of a closed-loop control device as illustrated in FIG. 3, and its details will be described below. The first chemical liquid CLC 121 controls the flow rate of the chemical liquid from the chemical liquid utility box 50 to output them. The first DIW CLC 122 controls the flow rate of the DIW from the regulator 60 to output it. The first chemical liquid CLC 121 includes an output portion connected to a pipe 83. The first DIW CLC 122 includes an output portion connected to a pipe 93. The pipe 83 and the pipe 93 join together to the pipe 85. The pipe 83, the pipe 93, and the pipe 85 have a join point that constitutes the mixing portion 123. The mixing portion 123 mixes the chemical liquid whose flow rate is controlled in the first chemical liquid CLC 121 with the DIW whose flow rate is controlled in the first DIW CLC 122 to output the chemical liquid (the chemical liquid after dilution) having the desired flow rate and concentration. The flow rate and the concentration of the chemical liquid after dilution are determined corresponding to the flow rates of the chemical liquid and the DIW set in the first chemical liquid CLC 121 and the first DIW CLC 122 by the signal from the control device 110.

FIG. 3 is a block diagram illustrating a configuration of the flow rate control valve unit (CLC) according to the one embodiment. The first chemical liquid CLC 121 and the first DIW CLC 122 include a flowmeter 1212, a flow rate control valve (an internal control valve) 1211, and a control unit 1213 as illustrated in FIG. 3. The flowmeter 1212 of the first chemical liquid CLC 121 is an ultrasonic flowmeter. From an aspect of reduction in pressure loss, the ultrasonic flowmeter is preferably used as the flowmeter 1212. However, considering the pressure loss in the whole of the cleaning liquid supply device 100 and the cleaning device 200, a differential pressure flowmeter (an orifice flowmeter) may be used. As the flowmeter 1212 of the first DIW CLC 122, a differential pressure flowmeter (an orifice flowmeter) is used. As the flowmeter 1212 of the first DIW CLC 122, an ultrasonic flowmeter may be employed. The flow rate control valve 1211 is a motor valve in this embodiment. A degree of opening of a valve body 1211a is controlled by power of a driving source 1211b including a motor. The flow rate control valve 1211 may be a valve whose degree of opening is adjustable; that is the flow rate control valve 1211 may be another type of variable flow rate valve (for example, a solenoid valve driven by a solenoid or the like). The control unit 1213 includes a control circuit such as a microcomputer, and a memory that stores a program executed in the control circuit. The control circuit and the memory are implemented in, for example, a control substrate. The control unit 1213 receives a flow rate set value iT of a fluid from the control device 110 and receives a flow rate detected value io of a fluid from the flowmeter 1212 to perform feedback control on the flow rate control valve 1211 such that the flow rate detected value io matches up with the flow rate set value iT. In the first chemical liquid CLC 121, the fluid is the chemical liquid. In the first DIW CLC 122, the fluid is the DIW.

Here, the flow rate control valve unit (CLC) including the flowmeter, the flow rate control valve, and the control unit is exemplified, but a part or all of them may be disposed as separate bodies. For example, the flowmeter 1212 and the flow rate control valve 1211 may be disposed as the separate bodies, and instead of the control unit 1213 (or via the control unit 1213), the control device 110 may control the flow rate control valve 1211 based on a detected value from the flowmeter 1212 to control the flow rate. The control device 110 may control the flow rate control valve 1211 via another driving circuit as necessary.

The first chemical liquid dilution box 120 further includes a suck back valve unit 141 and a pressure gauge 142 as illustrated in FIG. 2. The suck back valve unit 141 is an open/close valve having a dripping prevention function. The suck back valve unit 141 is a valve unit including a suck back valve, which suctions the fluid on a downstream side with a function that generates a volume change by deformation of a diaphragm, and an open/close valve (a stop valve, a two-way valve), which opens and closes the flow passage. The suck back valve unit 141 ensures reduction or prevention of dripping from the nozzle 211 (see FIG. 2) when the output of the chemical liquid (the chemical liquid after dilution) from the first chemical liquid dilution box 120 is cut off. The pressure gauge 142, which is one that detects a pressure of the chemical liquid (the chemical liquid after dilution) output by the mixing portion 123, detects the pressure of the chemical liquid (the chemical liquid after dilution) in the pipe 85 where the pipe 83 and the pipe 93 join together.

The second chemical liquid dilution box 130 controls the respective flow rates of the chemical liquid and the DIW to output the chemical liquid (the chemical liquid after dilution) having the desired flow rate and concentration. The second chemical liquid dilution box 130 controls the respective flow rates of the chemical liquid and the DIW independently from the control of the first chemical liquid dilution box 120. The second chemical liquid dilution box 130 includes an input portion connected to the chemical liquid utility box 50 via the pipe 80 and a pipe 82 and connected to the regulator 60 via the pipe 90 and the pipe 92. The second chemical liquid dilution box 130 includes an output portion connected to a nozzle 212 of the cleaning portion 210 in the cleaning device 200 via a pipe 95 and connected to a nozzle (not illustrated) of a waiting portion 230 in the cleaning device 200 via a pipe 96.

The second chemical liquid dilution box 130 includes a second chemical liquid CLC (a second chemical-liquid-flow-rate control unit) 131, a second DIW CLC (a second dilution-water-flow-rate control unit) 132, and a mixing portion 133. The second chemical liquid CLC 131 controls a flow rate of the chemical liquid from the chemical liquid utility box 50 to output them. The second DIW CLC 132 controls a flow rate of the DIW from the regulator 60 to output it. The second chemical liquid CLC 131 includes an output portion connected to a pipe 84. The second DIW CLC 132 includes an output portion connected to a pipe 94. The pipe 84 and the pipe 94 join together to the pipe 86. The pipe 84, the pipe 94, and the pipe 86 have a join point that constitutes the mixing portion 133. The mixing portion 133 mixes the chemical liquid whose flow rate is controlled in the second chemical liquid CLC 131 with the DIW whose flow rate is controlled in the second DIW CLC 132 to output the chemical liquid (the chemical liquid after dilution) having the desired flow rate and concentration. The flow rate and the concentration of the chemical liquid after dilution are determined corresponding to the flow rates of the chemical liquid and the DIW set in the second chemical liquid CLC 131 and the second DIW CLC 132 by the signal from the control device 110.

The second chemical liquid CLC 131 and the second DIW CLC 132 have the configuration illustrated in FIG. 3 similarly to the first chemical liquid CLC 121 and the first DIW CLC 122. The flowmeter 1212 of the second chemical liquid CLC 131 is an ultrasonic flowmeter similarly to the first chemical liquid CLC 121. From the aspect of the reduction in the pressure loss, the ultrasonic flowmeter is preferably used as the flowmeter 1212. However, considering the pressure loss in the whole of the cleaning liquid supply device 100 and the cleaning device 200, a differential pressure flowmeter (an orifice flowmeter) may be used. As the flowmeter 1212 of the second DIW CLC 132, a differential pressure flowmeter (an orifice flowmeter) is used similarly to the first DIW CLC 122. As the flowmeter 1212 of the second DIW CLC 132, an ultrasonic flowmeter may be employed. In the second chemical liquid CLC 131, the fluid is the chemical liquid. In the second DIW CLC 132, the fluid is the DIW. Other configurations are as described above. Thus, their description is omitted.

The second chemical liquid dilution box 130 further includes an open/close valve 151, an open/close valve 152, and a pressure gauge 153 as illustrated in FIG. 2. The open/close valve 151 is disposed on the pipe 95 branched from the pipe 86. The open/close valve 151 releases and cuts off a fluid connection between the mixing portion 133 and the nozzle 212 on a side of a substrate lower surface in the cleaning device 200. The open/close valve 152 is disposed on the pipe 96 branched from the pipe 86. The open/close valve 152 releases and cuts off a fluid connection between the mixing portion 133 and the waiting portion 230 in the cleaning device 200. The pressure gauge 153, which is one that detects a pressure of the chemical liquid (the chemical liquid after dilution) output by the mixing portion 133, detects the pressure of the chemical liquid in the pipe 86 where the pipe 84 and the pipe 94 join together.

The cleaning device 200, which is installed on the substrate processing device such as the polishing device, is a device that cleans a substrate W. The cleaning device 200, which is connected to the cleaning liquid supply device 100 via the pipes 85, 95, and 96 as illustrated in FIG. 2, receives the supply of the chemical liquid (the chemical liquid after dilution) and/or the DIW from the cleaning liquid supply device 100. The cleaning device 200 includes the cleaning portion 210 and the waiting portion 230. The cleaning portion 210 supplies a first surface and a second surface (in this example, an upper surface and a lower surface) of the substrate W with the chemical liquid (the chemical liquid after dilution) to clean the substrate W with the chemical liquid. A substrate waiting the cleaning in the cleaning portion 210 is arranged on the waiting portion 230. When the cleaning device 200 includes a DIW cleaning portion where the cleaning is performed with the DIW, a pipe to supply the DIW may be disposed on the cleaning liquid supply device 100. Any of the first surface and the second surface of the substrate W may be an upper surface the lower surface of the substrate W. When the substrate W is arranged standing in a vertical direction, the first surface and the second surface of the substrate W are surfaces extending in the vertical direction.

The cleaning portion 210 includes one or a plurality of nozzles 211 arranged on a side of the upper surface of the substrate W and the nozzle 212 arranged on a side of the lower surface of the substrate W. For avoiding complicated drawing, FIG. 2 illustrates only one nozzle 211.

The one or plurality of nozzles 211, which are arranged on the upper side of the substrate W, inject the chemical liquid (the chemical liquid after dilution) toward the upper surface of the substrate W. The nozzle 211, which is connected to the output of the first chemical liquid dilution box 120 in the cleaning liquid supply device 100 via the pipe 85, receives the supply of the chemical liquid (the chemical liquid after dilution) adjusted to have the desired flow rate and concentration in the first chemical liquid dilution box 120. As a part or all of the nozzles 211, low-pressure-loss-type nozzles (for example, one having a flat type injection port) are preferably used to reduce the pressure loss in the flow passage.

The nozzle 212 has a configuration where a plurality of nozzle holes are provided on a common chassis. The nozzle 212, which is arranged on the lower side of the substrate W, injects the chemical liquid (the chemical liquid after dilution) toward the lower surface of the substrate W. The nozzle 212, which is connected to the output of the second chemical liquid dilution box 130 in the cleaning liquid supply device 100 via the pipe 95, receives the supply of the chemical liquid (the chemical liquid after dilution) adjusted to have the desired flow rate and concentration in the second chemical liquid dilution box 130. As the nozzle 212, a low-pressure-loss-type nozzle is preferably used to reduce the pressure loss in the flow passage.

The waiting portion 230 receives the supply of the chemical liquid (the chemical liquid after dilution) adjusted to have the desired flow rate and concentration in the second chemical liquid dilution box 130. The open/close valves 151 and 152 may be controlled to supply only any one of the nozzle 212 of the cleaning portion 210 or the waiting portion 230 with the chemical liquid (the chemical liquid after dilution) from the second chemical liquid dilution box 130.

From the aspect to reduce the pressure loss in the flow passage, as the pipes from the supply sources 20 and 30 to the nozzles 211 and 212 and the waiting portion 230, ones having a large inner diameter and a small pressure loss are preferably used. As the valves (52, 151, 152, and 141) as well, ones having a small pressure loss are preferably used.

(Chemical Liquid Supply Process)

The following describes a chemical liquid or cleaning liquid supply process in the cleaning liquid supply device 100 illustrated in FIG. 2. Usually, the lockout valve 53 has been released. The open/close valve 52 of the chemical liquid utility box 50 is released by the signal from the control device 110 at the start of the chemical liquid supply process. The regulator 60 is operated by the signal from the control device 110. The suck back valve unit 141, the open/close valve 151, and the open/close valve 152 are released by the signal from the control device 110. The chemical liquid utility box 50 and the regulator 60 supply the first chemical liquid dilution box 120 and the second chemical liquid dilution box 130 with the chemical liquid and the DIW. The open/close valve 52, the regulator 60, the suck back valve unit 141, and the open/close valves 151 and 152 are controlled by the signal from the control device 110. The control device 110 controls the first chemical liquid CLC 121 and the first DIW CLC 122 in accordance with the program stored in the storing medium.

In the first chemical liquid dilution box 120, the first chemical liquid CLC 121 controls the flow rate of the chemical liquid to have a flow rate set value from the control device 110, the first DIW CLC 122 controls the flow rate of the DIW to have a flow rate set value from the control device 110, and the mixing portion 123 mixes the chemical liquid with the DIW after the flow rate adjustment to generate the chemical liquid (the chemical liquid after dilution) controlled to have predetermined flow rate and concentration, thus outputting them to the nozzle 211 on a side of the substrate upper surface in the cleaning device 200. The first chemical liquid CLC 121 and the first DIW CLC 122 are controlled by the signal from the control device 110. The control device 110 controls the first chemical liquid CLC 121 and the first DIW CLC 122 in accordance with the program stored in the storing medium.

In the second chemical liquid dilution box 130, the second chemical liquid CLC 131 controls the flow rate of the chemical liquid to have a flow rate set value from the control device 110, the second DIW CLC 132 controls the flow rate of the DIW to have a flow rate set value from the control device 110, and the mixing portion 133 mixes the chemical liquid with the DIW after the flow rate adjustment to generate the chemical liquid (the chemical liquid after dilution) controlled to have predetermined flow rate and concentration, thus outputting them to the nozzle 212 on the substrate lower surface side in the cleaning device 200. The mixing portion 133 supplies the waiting portion 230 in the cleaning device 200 with the chemical liquid (the chemical liquid after dilution) controlled to have the predetermined flow rate and concentration. The second chemical liquid CLC 131 and the second DIW CLC 132 are controlled by the signal from the control device 110. The control device 110 controls the second chemical liquid CLC 131 and the second DIW CLC 132 in accordance with the program stored in the storing medium.

When one of the supply of the chemical liquid (the chemical liquid after dilution) to the nozzle 211 and the nozzle 212 is stopped, one of the suck back valve unit 141 or the open/close valve 151 is closed and one is opened (the flow rate control valves of the first chemical liquid CLC 121 and the first DIW CLC 122 or the flow rate control valves of the second chemical liquid CLC 131 and the second DIW CLC 132 may be closed).

When the chemical liquid (the chemical liquid after dilution) are supplied to the nozzle 211 and the supply of the chemical liquid to the nozzle 212 and the waiting portion 230 is stopped, the open/close valve 141 is opened and the open/close valves 151 and 152 are closed (the flow rate control valves of the second chemical liquid CLC 131 and the second DIW CLC 132 may be closed).

When one of the supply of the chemical liquid (the chemical liquid after dilution) to the nozzle 212 or the waiting portion 230 is stopped, one of the open/close valve 151 or the open/close valve 152 is closed.

In the cleaning portion 210 of the cleaning device 200, the respective chemical liquid (chemical liquid after dilution) whose flow rates and concentrations are controlled independently in the first chemical liquid dilution box 120 and the second chemical liquid dilution box 130 are supplied to the upper surface and the lower surface of the substrate W from the nozzle 211 and the nozzle 212 to clean the substrate W. For example, the chemical liquid having a concentration lower than a concentration of the chemical liquid to the nozzle 212 can be supplied to the nozzle 211. The cleaning device 200 is controlled by the signal from the control device 110. The control device 110 controls the cleaning device 200 in accordance with the program stored in the storing medium.

(Flowchart)

Figure 4:
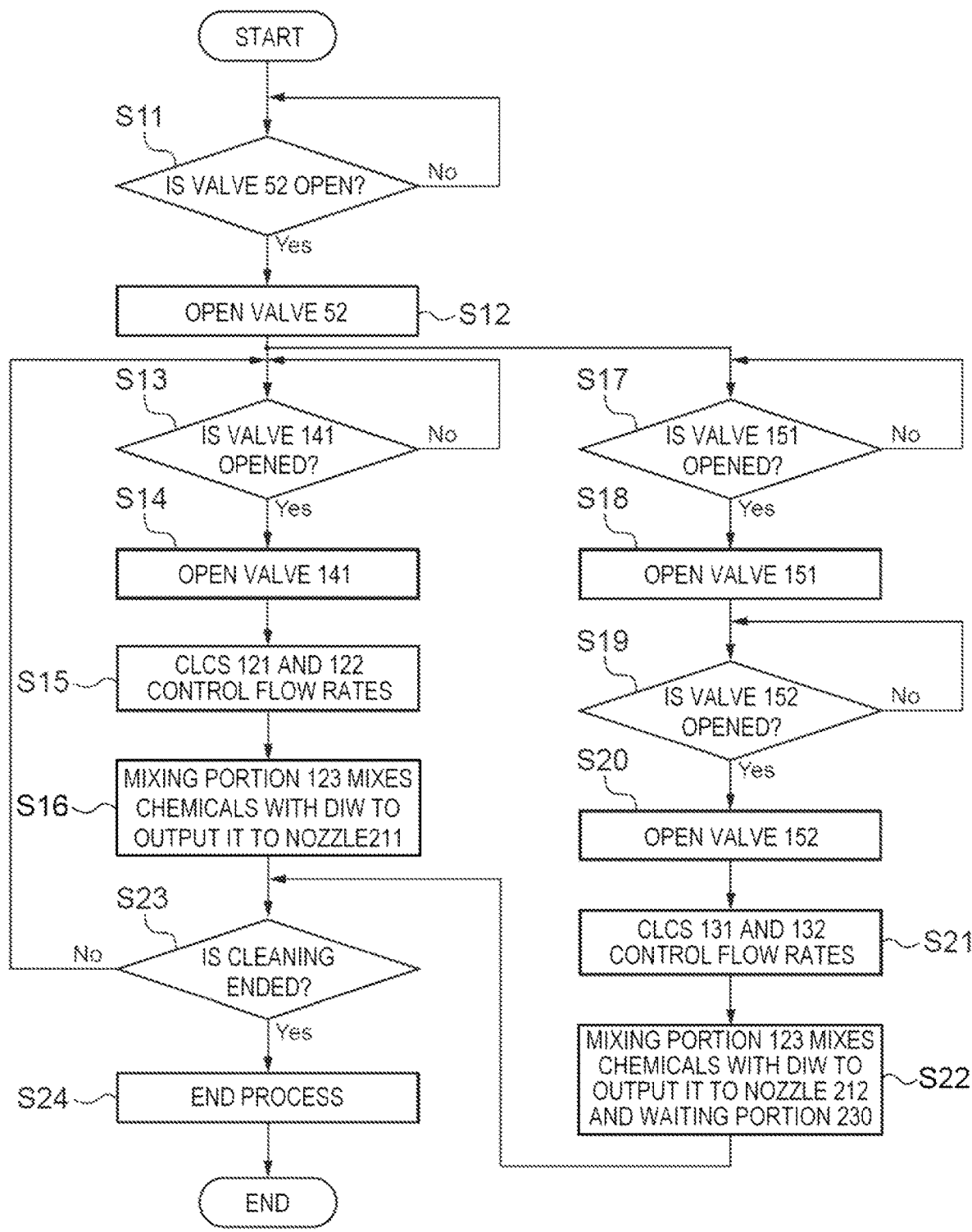
FIG. 4 is an exemplary flowchart of a chemical liquid supply process.

FIG. 4 is an exemplary flowchart of the chemical liquid supply process. These processes are executed in the control device 110.

In Step S11, it is determined whether the open/close valve 52 is released or not. When it is determined that the open/close valve 52 is released in Step S11, the open/close valve 52 is released by the signal from the control device 110 in Step S12.

In Step S13, it is determined whether the suck back valve unit 141 is released or not. When it is determined that the suck back valve unit 141 is released in Step S13, the suck back valve unit 141 is released by the signal from the control device 110 in Step S14. When the suck back valve unit 141 has already been released, the state where the suck back valve unit 141 has been released is maintained. Meanwhile, when it is determined that the state where the suck back valve unit 141 has been closed is maintained or the suck back valve unit 141 is closed, the suck back valve unit 141 is controlled by the control device 110 so that the state where the suck back valve unit 141 has been closed is maintained or the suck back valve unit 141 is closed.

In Step S15, in the first chemical liquid dilution box 120, the first chemical liquid CLC 121 controls the flow rate of the chemical liquid to have the flow rate set value from the control device 110, and the first DIW CLC 122 controls the flow rate of the DIW to have the flow rate set value from the control device 110.

In Step S16, the mixing portion 123 mixes the chemical liquid with the DIW after the flow rate adjustment to generate the chemical liquid (the chemical liquid after dilution) controlled to have the predetermined flow rate and concentration, thus outputting them to the nozzle 211 on the substrate upper surface side in the cleaning device 200. When the valve 141 has been closed, the chemical liquid (the chemical liquid after dilution) are not output to the nozzle 211 on the substrate upper surface side in the cleaning device 200. In this case, the operation of the first chemical liquid CLC 121 and the first DIW CLC 122 may be stopped.

In Step S17, it is determined whether the open/close valve 151 is released or not. When it is determined that the open/close valve 151 is released in Step S17, the open/close valve 151 is released by the signal from the control device 110 in Step S18. When the open/close valve 151 has already been released, the state where the open/close valve 151 has been released is maintained. Meanwhile, when it is determined that the state where the open/close valve 151 has been closed is maintained or the open/close valve 151 is closed, the open/close valve 151 is controlled by the control device 110 so that the state where the open/close valve 151 has been closed is maintained or the open/close valve 151 is closed.

In Step S19, it is determined whether the open/close valve 152 is released or not. When it is determined that the open/close valve 152 is released in Step S19, the open/close valve 152 is released by the signal from the control device 110 in Step S20. When the open/close valve 152 has already been released, the state where the open/close valve 152 has been released is maintained. Meanwhile, when it is determined that the state where the open/close valve 152 has been closed is maintained or the open/close valve 152 is closed, the open/close valve 152 is controlled by the control device 110 so that the state where the open/close valve 152 has been closed is maintained or the open/close valve 152 is closed.

In Step S21, in the second chemical liquid dilution box 130, the second chemical liquid CLC 131 controls the flow rate of the chemical liquid to have the flow rate set value from the control device 110, and the second DIW CLC 132 controls the flow rate of the DIW to have the flow rate set value from the control device 110.

In Step S22, the mixing portion 133 mixes the chemical liquid with the DIW after the flow rate adjustment to generate the chemical liquid (the chemical liquid after dilution) controlled to have the predetermined flow rate and concentration, thus outputting them to the nozzle 212 on the substrate lower surface side and outputting them to the waiting portion 230 in the cleaning device 200.

When the open/close valve 151 has been closed, the chemical liquid (the chemical liquid after dilution) are not output to the nozzle 212 on the substrate lower surface side in the cleaning device 200. When the open/close valve 152 has been closed, the chemical liquid (the chemical liquid after dilution) are not supplied to the waiting portion 230. When both of the open/close valves 151 and 152 have been closed, the chemical liquid (the chemical liquid after dilution) are not supplied to the nozzle 212 and the waiting portion 230. When both of the open/close valves 151 and 152 have been closed, the operation of the second chemical liquid CLC 131 and the second DIW CLC 132 may be stopped.

In Step S23, it is determined whether there is an end instruction of the chemical liquid supply process or not. When there is the end instruction, after an end process such as closing the released valve and stopping the regulator and the CLC is executed in Step S24, the chemical liquid supply process is ended. Meanwhile, there is no end instruction, returning to Step S13, the processes in Steps S13 to S16 and Steps S17 to S22 are repeated.

With this chemical liquid supply process, the first chemical liquid dilution box 120 and the second chemical liquid dilution box 130 each are allowed to control the flow rate and the concentration of the chemical liquid independently (S13 to S16, S17 to S22). The supply of the chemical liquid (the chemical liquid after dilution) from one of the first chemical liquid dilution box 120 or the second chemical liquid dilution box 130 can be stopped (S13 and S14, S17 to S20).

(Exemplary Substrate Processing Device)

Figure 5:
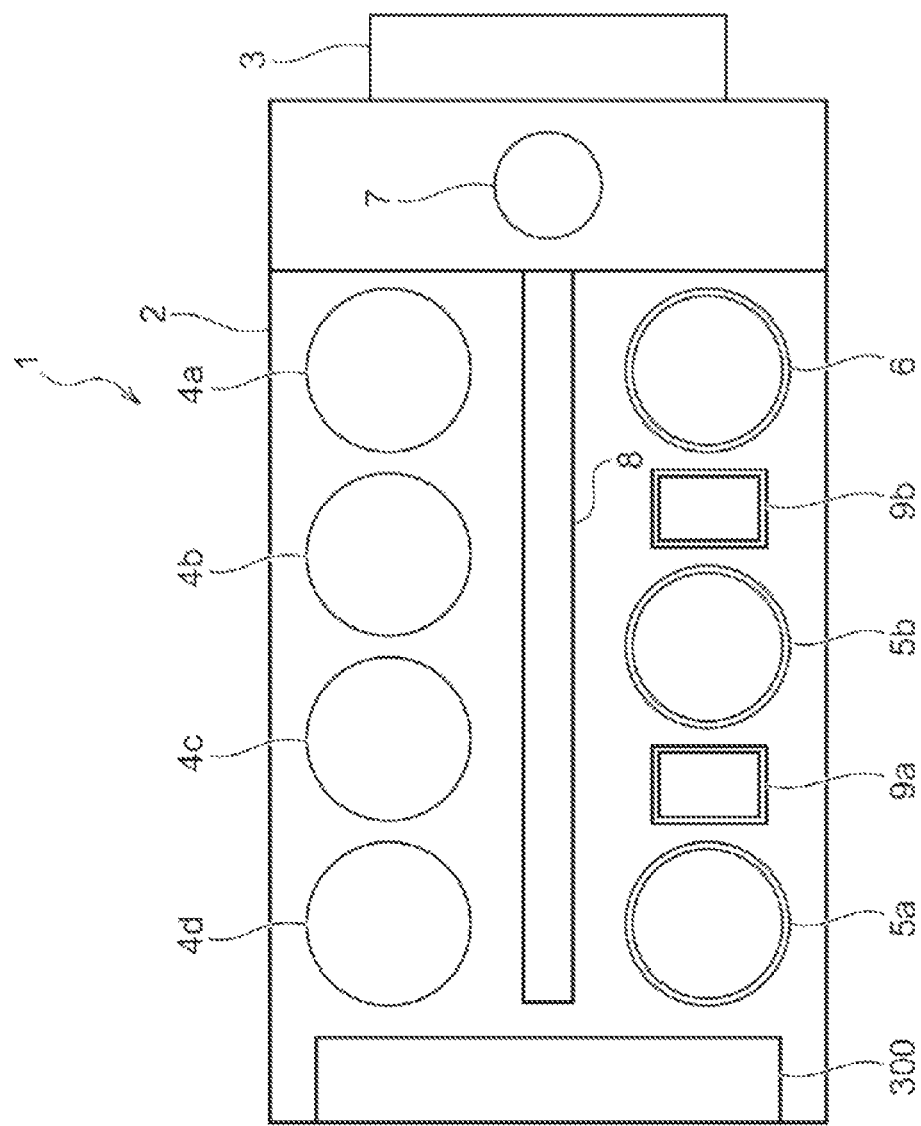
FIG. 5 is a plan view illustrating an overall configuration of a polishing device including the cleaning unit according to the one embodiment.

The following describes an exemplary configuration of the polishing device as one example of the substrate processing device including the cleaning unit according to the above-described one embodiment. FIG. 5 is a plan view illustrating an overall configuration of the polishing device including the cleaning unit according to the one embodiment.

As illustrated in FIG. 5, a polishing device 1 includes a housing 2 in an about rectangular shape and a load port 3 on which a substrate cassette, which stocks a plurality of substrates such as semiconductor wafers, is placed. An open cassette, a Standard Manufacturing Interface (SMIF) pod, or a Front Opening Unified Pod (FOUP) can be mounted on the load port 3. The housing 2 internally houses a plurality of (in this example, four) polishing units 4a to 4d, cleaning units 5a and 5b, which clean the substrate after polishing, and a drying unit 6, which dries the substrate after cleaning. The cleaning unit 10 according to the embodiment of the present invention is applied to at least one of the cleaning units 5a and 5b.

A first transport robot 7 is arranged in a region surrounded by the load port 3, the polishing unit 4a, and the drying unit 6. A transport unit 8 is arranged parallel to the polishing units 4a to 4d. The first transport robot 7 receives the substrate before polishing from the load port 3 to hand over it to the transport unit 8, and receives the substrate after drying from the drying unit 6 to return it to the load port 3. The transport unit 8 transports or conveys the substrate received from the first transport robot 7 to perform delivery and receipt of the substrate between the respective polishing units 4a to 4d. A second transport robot 9a is arranged positioned between the cleaning unit 5a and the cleaning unit 5b to perform delivery and receipt of the substrate between the transport unit 8 and these respective units 5a and 5b. A third transport robot 9b is arranged positioned between the cleaning unit 5b and the drying unit 6 to perform delivery and receipt of the substrate between these respective units 5b and 6. Further, a control device 300 is arranged positioned in the housing 2 to control operation of each equipment of the polishing device 1. As the above-described control device 110, the control device 300 of the polishing device may be used.

Figure 6A:
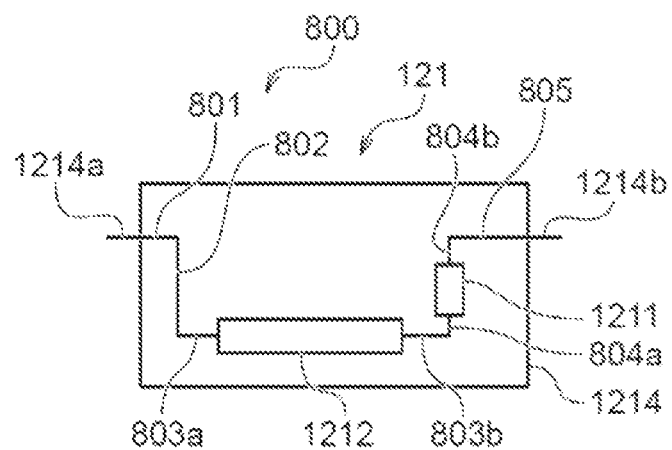
FIG. 6A is an explanatory view describing a mounting structure of the CLC.
Figure 6B:
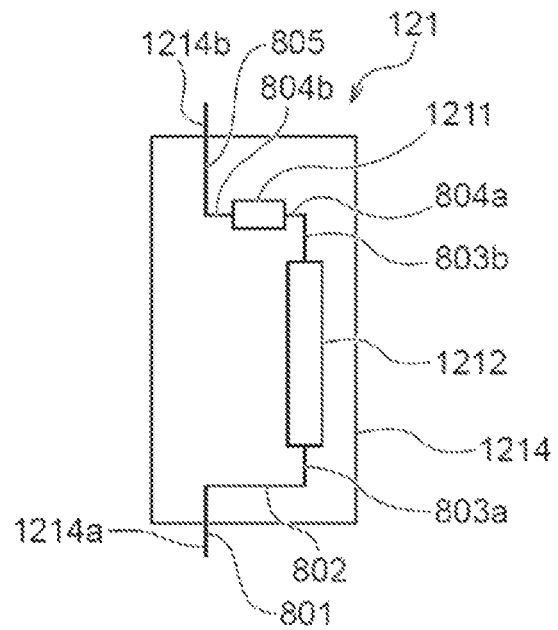
FIG. 6B is an explanatory view describing a mounting structure of the CLC.
Figure 6C:
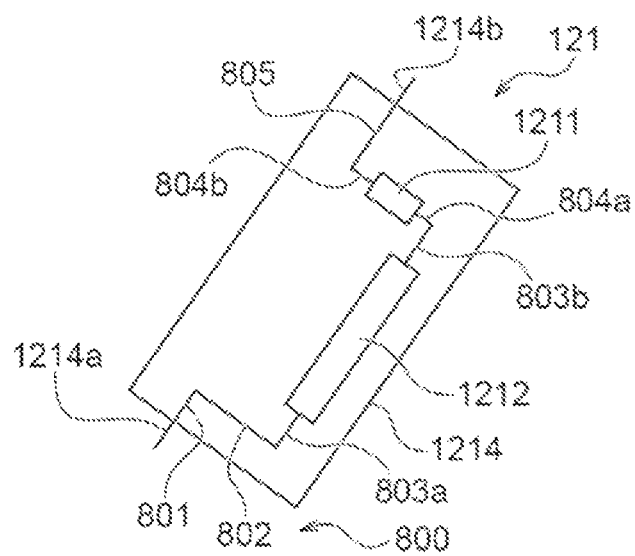
FIG. 6C is an explanatory view describing a mounting structure of the CLC.

FIG. 6A to FIG. 6C are explanatory views describing mounting structures of the CLC. In the following description, the first chemical liquid CLC 121 is exemplified as the CLC, but other chemical liquid CLC and DIW CLC have similar configurations. As described above, the first chemical liquid CLC 121 includes the flow rate control valve 1211 and the flowmeter 1212, and they are connected with a pipe 800 to be housed in a chassis 1214. FIG. 6A illustrates a case where the first chemical liquid CLC 121 is mounted so that a direction of the fluid passing through the flowmeter 1212 is a horizontal direction, that is, so that piping parts 803a and 803b are horizontal. FIG. 6B illustrates a case where the first chemical liquid CLC 121 is mounted so that the direction of the fluid passing through the flowmeter 1212 is the vertical direction. FIG. 6C illustrates a case where the first chemical liquid CLC 121 is mounted so that the direction of the fluid passing through the flowmeter 1212 is inclined with respect to the vertical direction and the horizontal direction. The vertical direction and the horizontal direction are assumed to indicate a vertical direction and a horizontal direction with respect to an installation surface of a device such as the cleaning liquid supply device. Piping parts 801, 802, and 803a may be formed by performing bending work on one pipe, or may be formed such that a part or all of the piping parts are prepared as separate bodies and they are connected to one another. Piping parts 803b and 804a may be formed by performing bending work on one pipe, or may be formed such that a part or all of the piping parts are prepared as separate bodies and they are connected to one another. Piping parts 804b and 805 may be formed by performing bending work on one pipe, or may be formed such that a part or all of the piping parts are prepared as separate bodies and they are connected to one another. The piping parts 803a and 803b can be connected as one pipe, and the flowmeter as arranged in its peripheral area can be used. In the following description, when it is not necessary to distinguish the piping parts 803*a* and 803*b*, any piping part 803*a* or 803*b* or a combination of the piping parts 803*a* and 803*b* may be referred to as a piping part 803. The same applies to the piping parts 804*a* and 804*b*.

As illustrated in FIG. 6A to FIG. 6C, the pipe 800 in the first chemical liquid CLC 121 includes the piping parts 801, 803*a*, 803*b*, and 805 extending in the horizontal direction and the piping parts 802, 804*a*, and 804*b* extending in the vertical direction when the chassis 1214 is arranged such that its longitudinal direction is oriented in the horizontal direction (FIG. 6A). When the first chemical liquid CLC 121 is arranged in the state in FIG. 6A, the piping parts 803*a* and 803*b* on an inlet side and an exit side of the flowmeter 1212 are oriented in the horizontal direction, thus causing a state where air bubbles are likely to remain in the fluid inside the piping parts 803*a* and 803*b*. Bent portions where the respective piping parts are bent are formed near a boundary between the piping part 803*a* extending in the horizontal direction and the piping part 802 extending in the vertical direction and near a boundary between the piping part 803*b* extending in the horizontal direction and the piping part 804*a* extending in the vertical direction. The air bubbles are likely to remain near such a bent portion. The air bubbles remain at these parts to cause the air bubbles to be contained also in the fluid passing through the flowmeter 1212. When the flowmeter 1212 is the ultrasonic flowmeter, a detection accuracy of the flow rate possibly decreases due to the air bubbles in the fluid. Also when the flowmeter 1212 is the differential pressure flowmeter, the detection accuracy of the flow rate possibly decreases if drift (bias of the flow rate) is generated caused by the air bubbles in the pipe or in the fluid. In the state in FIG. 6B, the air bubbles are likely to remain in the piping parts 802, 804*a*, and 804*b* extending in the horizontal direction, and the air bubbles are likely to remain near the boundary between the piping part 802 extending in the horizontal direction and the piping part 803*a* extending in the vertical direction. The air bubbles remain at these parts to possibly cause the air bubbles to be contained also in the fluid passing through the flowmeter 1212. Similarly to the case in FIG. 6A, when the flowmeter 1212 is the ultrasonic flowmeter, the detection accuracy of the flow rate possibly decreases due to the air bubbles in the fluid. Also when the flowmeter 1212 is the differential pressure flowmeter, the detection accuracy of the flow rate possibly decreases if the drift (the bias of the flow rate) is generated caused by the air bubbles in the pipe or in the fluid.

Meanwhile, in the state in FIG. 6C, the respective piping parts of the pipe 800 are inclined with respect to the horizontal direction and the vertical direction. The flow passage in the flowmeter 1212 is also inclined with a gradient identical to those of the piping parts 803*a* and 803*b*. The piping parts 803*a* and 803*b* (a flow direction passing through the flowmeter) are preferably inclined with an angle of 10 degrees or more and 40 degrees or less with respect to the vertical direction. In this case, all of the piping part 802, the piping parts 803*a* and 803*b*, and the piping parts 804*a* and 804*b* are inclined with respect to the horizontal direction. Thus, the air bubbles are likely to pass through the boundary between the piping part 802 and the piping part 803*a* and the boundary between the piping part 803*b* and the piping part 804*a*, thus ensuring reduction in remaining of the air bubbles. The same applies to the piping part 801 and the piping part 802, and the same applies to the piping part 804*b* and the piping part 805. Therefore, as in FIG. 6C, mounting the first chemical liquid CLC 121 such that the respective piping parts of the pipe 800 are inclined with respect to the horizontal direction ensure reduction in air bubbles remaining in the pipe to suppress the air bubbles from being contained in the fluid passing through the flowmeter 1212. This results in an improvement in the detection accuracy of the flowmeter 1212.

In FIGS. 6A to 6C, the case where the pipe 800 has parts (the bent portions) bent into an L shape is illustrated, but the pipe 800 may have parts bent with an angle other than the right angle. Also when the pipe 800 is linear without having a bent part, mounting the first chemical liquid CLC 121 such that the pipe 800 is inclined with respect to the horizontal direction and the vertical direction as in FIG. 6C ensures the reduction in the air bubbles remaining in the pipe to suppress the air bubbles from being contained in the fluid passing through the flowmeter 1212. This results in the improvement in the detection accuracy of the flowmeter 1212. For example, it is a case where the piping parts 801, 802, 803*a*, 803*b*, 804*a*, 804*b*, and 805 are extending in a straight line in FIG. 6C.

In the mounting structure in FIG. 6A, when the piping parts 801 and 805 extending in the horizontal direction (in other words, an inlet portion 1214*a* and an outlet portion 1214*b* that open in the horizontal direction) are connected to external pipes extending in the vertical direction, joints to orthogonally change the direction of the flow passage are necessary in many cases. In the mounting structure in FIG. 6B, when the piping parts 801 and 805 extending in the vertical direction (in other words, the inlet portion 1214*a* and the outlet portion 1214*b* that open in the vertical direction) are connected to external pipes extending in the horizontal direction, joints to orthogonally change the direction of the flow passage are necessary in many cases. The joint causes the fluid to generate the pressure loss. Thus, from the aspect of the reduction in the pressure loss of the cleaning liquid supply device, the joint is preferably omitted.

Meanwhile, in the mounting structure in FIG. 6C, the piping parts 801 and 805 (the inlet portion 1214*a* and the outlet portion 1214*b*) have opening directions inclined from the horizontal direction and the vertical direction. Thus, the opening directions are gently oriented with respect to every pipe (piping part) extending in the horizontal direction and the vertical direction. Accordingly, the external pipes extending in the horizontal direction and the vertical direction are gently curved to be connected to the piping parts 801 and 805 (the inlet portion 1214*a* and the outlet portion 1214*b*). This allows the piping parts 801 and 805 (the inlet portion 1214*a* and the outlet portion 1214*b*) to be connected to the external pipes extending in the horizontal direction and the vertical direction without using the joints. In the example in FIG. 7 to FIG. 12, the external pipes extending in the horizontal direction and the vertical direction are gently curved to be connected to the piping part 801 (the inlet portion 1214*a*) and an outlet portion 1214*c* of a valve block 1216. This allows the piping part 801 (the inlet portion 1214*a*) and the outlet portion 1214*c* of the valve block 1216 to be connected to the external pipes extending in the horizontal direction and the vertical direction without using the joints (see FIG. 12).

Figure 7:
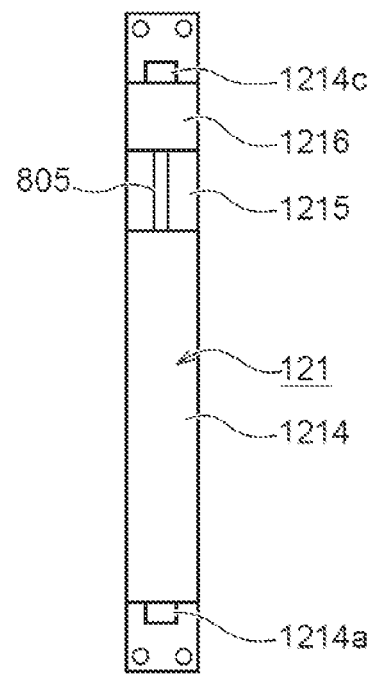
FIG. 7 is a plan view of the CLC.
Figure 8:
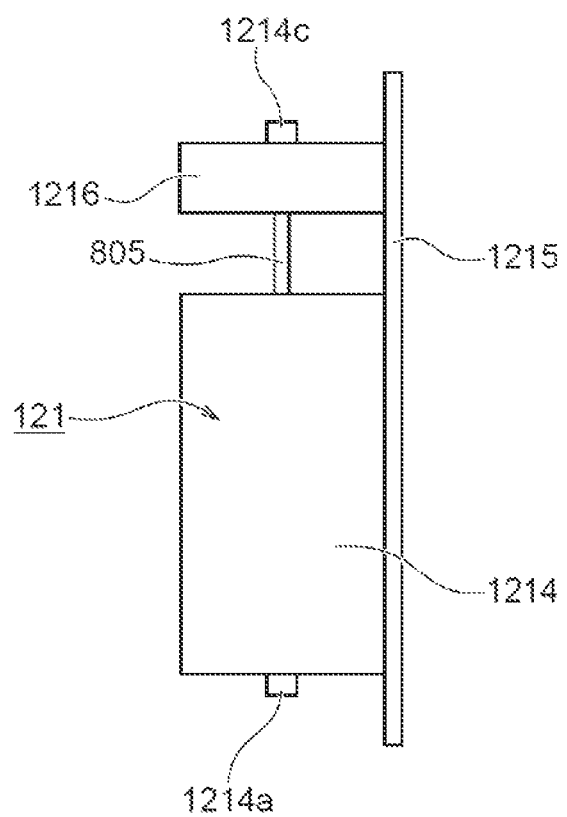
FIG. 8 is a side view of the CLC.

FIG. 7 is a plan view of the CLC. FIG. 8 is a side view of the CLC. In this example, the valve block 1216 is mounted on the first chemical liquid CLC 121. The first chemical liquid CLC 121 and the valve block 1216 are mounted on a base 1215. The inlet portion 1214*a* is disposed on the chassis 1214. Here, the outlet portion 1214*b* disposed on the piping part 805 in FIGS. 6A to 6C is integrally illustrated as a pipe between the first chemical liquid CLC 121 and the valve block 1216. The first chemical liquid CLC 121 may be connected to the valve block 1216 in any concatenation method. The inlet portion 1214a is disposed on one end side of the piping part 801 and opens in a direction where the piping part 801 is extending. Here, the inlet portion 1214a is exemplified as an end portion of the piping part 801, but a connector configured to be connected to a pipe from outside may be mounted. The outlet portion 1214c having a configuration of a connector configured to be connected to a pipe from outside is disposed on the valve block 1216. The inlet portion 1214a is connected to a primary side, that is, a side of the chemical liquid supply source 20 and the DIW supply source 30. The outlet portion 1214c is connected to a secondary side, that is, a side of the cleaning device 200.

Figure 9:
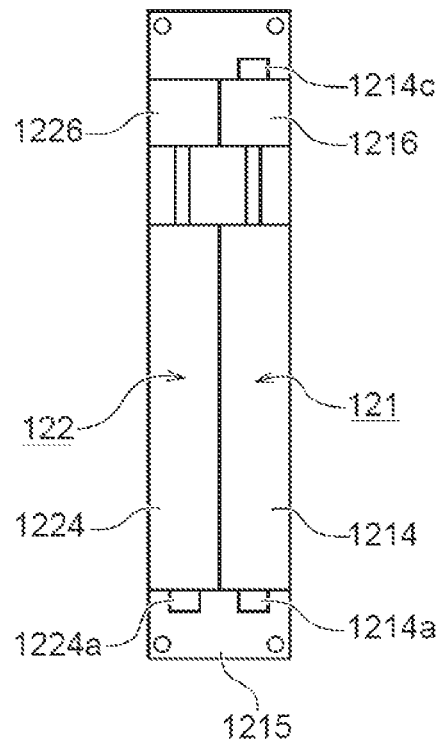
FIG. 9 is a plan view of a CLC assembly.
Figure 10A:
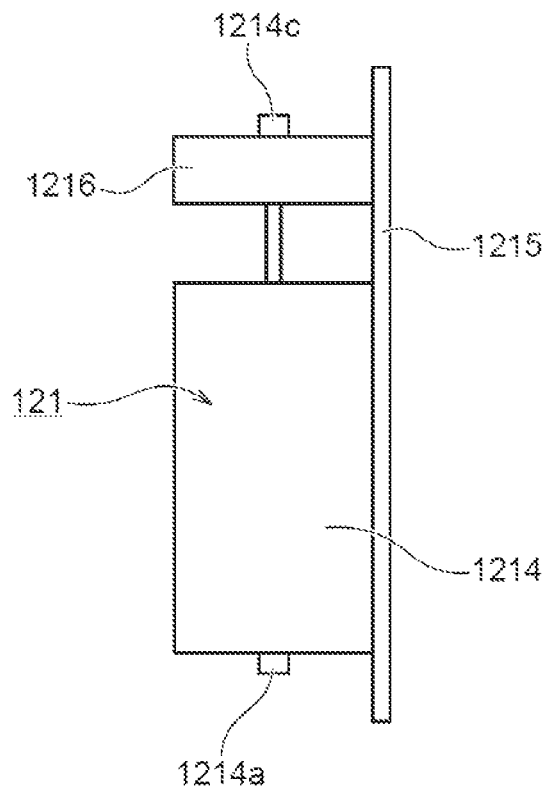
FIG. 10A is a side view from one side of the CLC assembly.
Figure 10B:
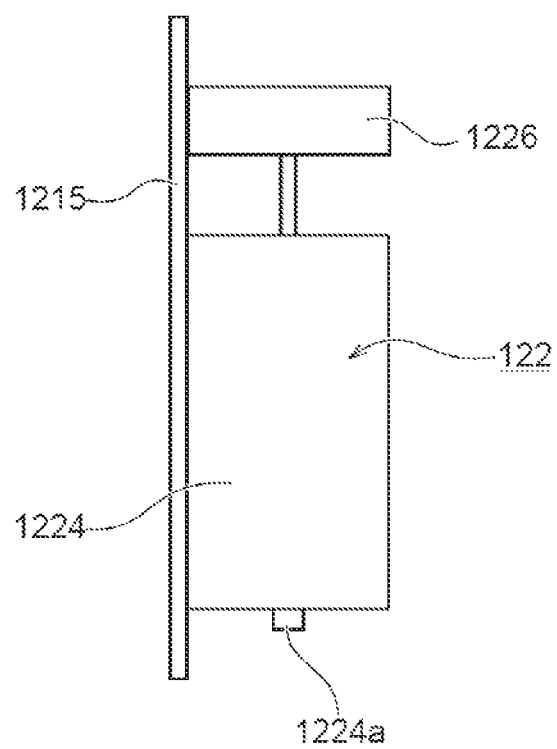
FIG. 10B is a side view from another side of the CLC assembly.

FIG. 9 is a plan view of a CLC assembly obtained by two CLCs are combined. FIG. 10A is a side view from one side of the CLC assembly. FIG. 10B is a side view from another side of the CLC assembly. In this example, an example where the first chemical liquid CLC 121 and the first DIW CLC 122 are combined is illustrated, but the same applies to a case where the second chemical liquid CLC 131 and the second DIW CLC 132 are combined. The first chemical liquid CLC 121 and the second chemical liquid CLC 131 may be combined, and the first DIW CLC 122 and the second DIW CLC 132 may be combined. In another embodiment, three or more CLCs may be combined to be mounted on a common base. Two or more CLCs may be arranged in a common chassis. A plurality of CLC combinations are referred to as the CLC assembly.

The first chemical liquid CLC 121 and the first DIW CLC 122 are secured to the common base 1215. In this example, the first chemical liquid CLC 121 includes the valve block 1216, and the first DIW CLC 122 includes a valve block 1226. These valve blocks 1216 and 1226 are arranged alongside and internally connected fluidically. That is, the fluid output from the first chemical liquid CLC 121 flows into the valve block 1216, and the fluid output from the first DIW CLC 122 flows into the valve block 1226. These fluids are mixed to be output from the outlet portion 1214c. The valve blocks 1216 and 1226 constitute the mixing portion 123 (see FIG. 2). The first chemical liquid CLC 121 and the first DIW CLC 122 may be connected to a single valve block.

Figure 11:
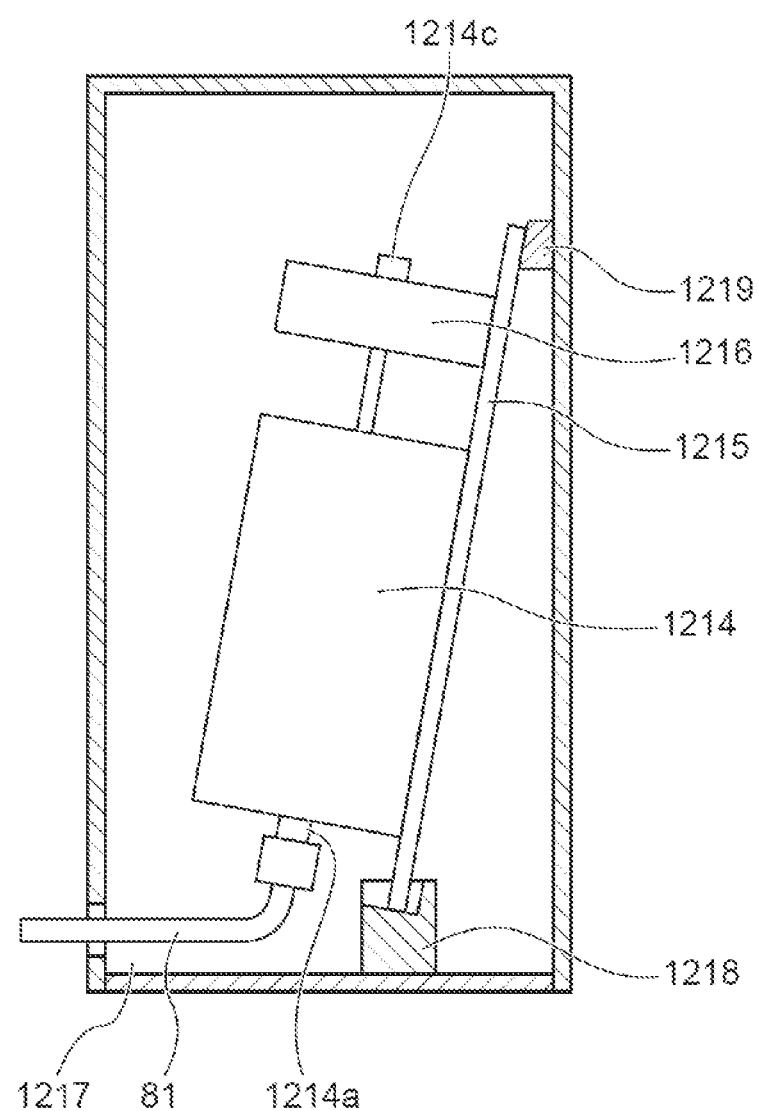
FIG. 11 is a side view of the mounting structure of the CLC.
Figure 12:
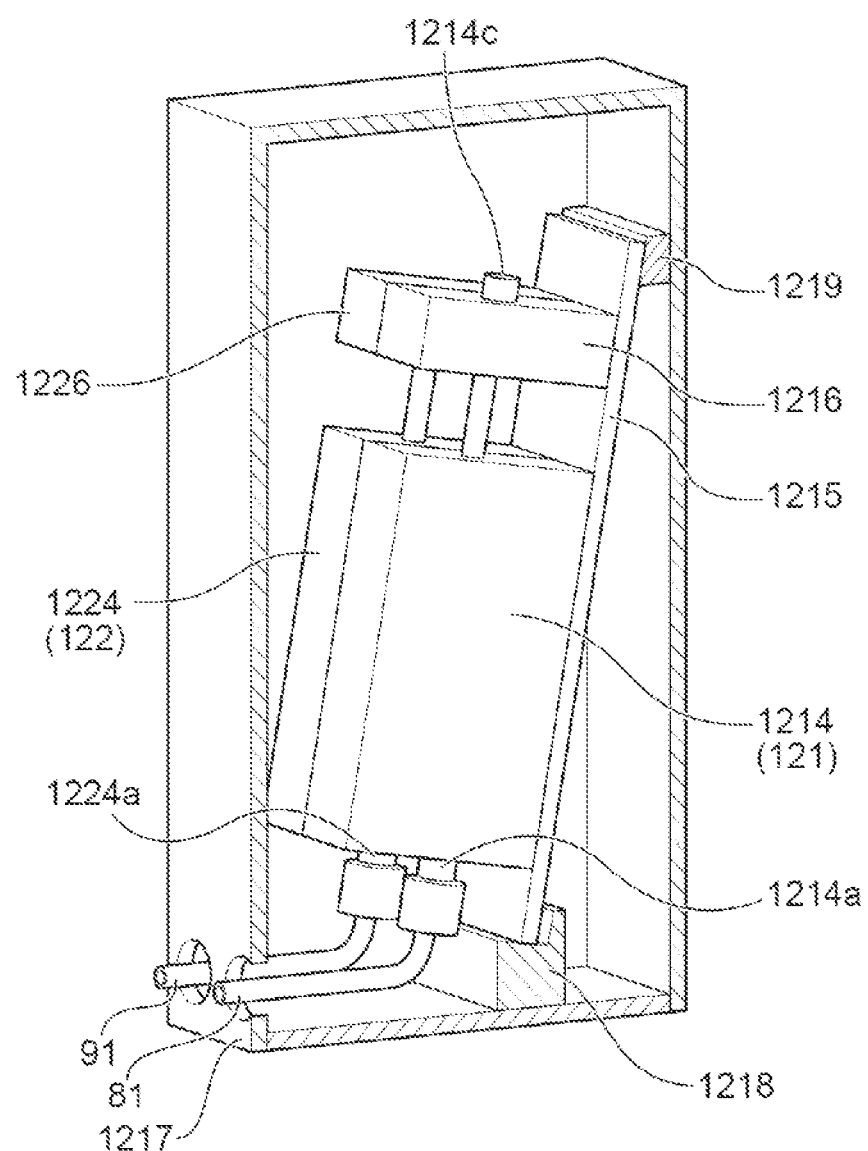
FIG. 12 is a perspective view of the mounting structure of the CLC.

FIG. 11 is a side view of the mounting structure of the CLC. FIG. 12 is a perspective view of the mounting structure of the CLC. In this example, a case where a plurality of CLCs are mounted via the common base 1215 is described, but each CLC may be mounted via an individual base. As illustrated in these drawings, the CLC assembly (the first chemical liquid CLC 121 and the second chemical liquid CLC) is mounted inclined from the horizontal direction and the vertical direction. The CLC assembly is mounted with mounting bases 1218 and 1219 disposed in a chassis 1217. The mounting base 1218 is secured to a bottom surface of the chassis 1217 and has one or a plurality of inclined surfaces that support one end side of the base 1215 of the CLC assembly. The mounting base 1219 is secured inside of a side surface of the chassis 1217 and has an inclined surface that supports the other end side of the base 1215 of the CLC assembly. The mounting base 1219 may be also configured to have a plurality of inclined surfaces. The base 1215 of the CLC assembly is secured to the mounting base 1219 with a fastening member such as a bolt. The base 1215 of the CLC assembly may be also secured to the mounting base 1218 with a fastening member. The inlet portion 1214a of the first chemical liquid CLC 121 is connected to the pipe 81 (FIG. 2). An inlet portion 1224a of the first DIW CLC 122 is connected to the pipe 91. The outlet portion 1214c is connected to the pipe 85 although not illustrated. Here, the case where the pipe 81 is connected to the inlet portion 1214a with the connector disposed on the pipe 81 is exemplified, but the connector may be disposed on a side of the chassis 1214 of the first chemical liquid CLC 121, that is, on the inlet portion 1214a. The same applies to the pipe 91 and the first DIW CLC 122.

With this configuration, none of the piping parts of the pipe 800 in the CLC is arranged along the horizontal direction, thus ensuring the reduction in remaining of air (the air bubbles) in the pipe. The air bubbles tend to be likely to remain near the bent portion (the bent part) of the pipe 800, but inclining the respective piping parts on both sides of the bent portion from the horizontal direction and the vertical direction ensures the reduction in the remaining of the air (the air bubbles) in the bent portion. The pipe 800 is inclined with respect to the vertical direction, thus ensuring the reduction in the pressure loss in the pipe 800. Also when the pipe 800 is extending in a straight line, arranging the pipe 800 inclined can obtain similar operational advantages.

Second Embodiment

Figure 13:
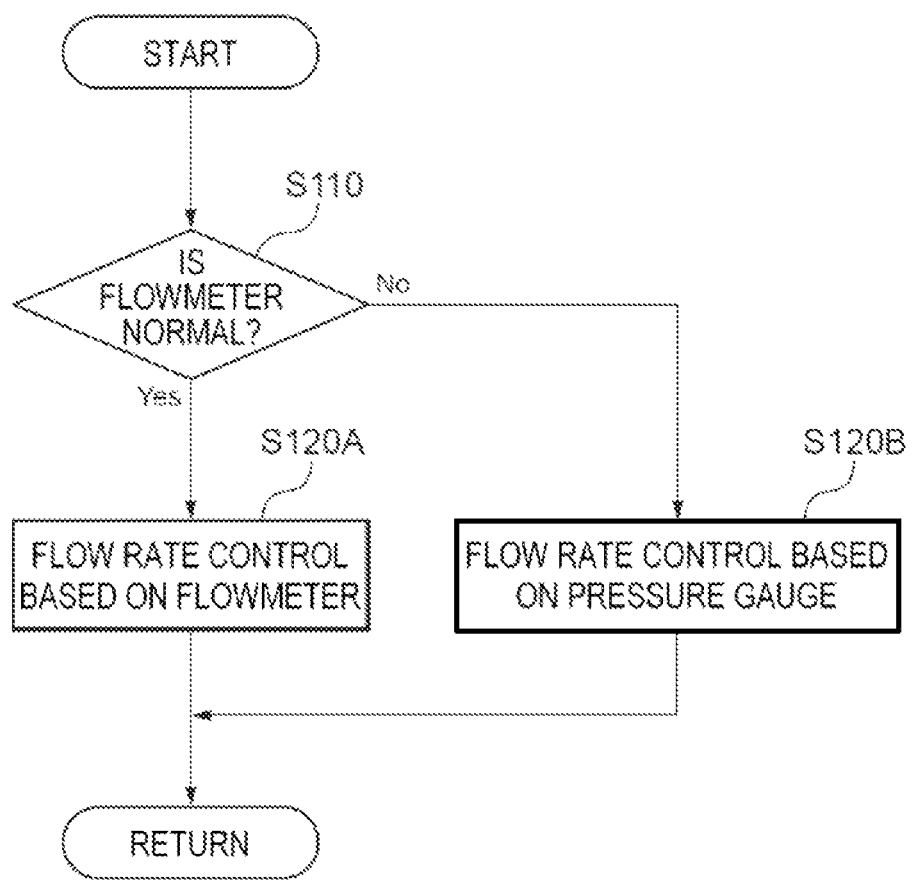
FIG. 13 is a flowchart of a flow rate control according to another example.

FIG. 13 is a flowchart of a flow rate control according to another example. In the above-described embodiment, the flow rate is controlled by the flow rate control valve 1211 based on the detected value of the flowmeter 1212 (S15 and S21 in FIG. 4), but the flow rate may be controlled based on the detected value by the pressure gauges 142 and 153. In the flowchart in FIG. 4, when an abnormality is detected in the flowmeter 1212, the control is switched to the control based on the pressure gauges 142 and 153. This control flow is executed in parallel with the control flow in FIG. 4, and at the point when the abnormality is detected in the flowmeter, the control is switched to the control based on the pressure gauge.

In Step S110, it is determined whether the flowmeter is normal or not. This determination is performed, for example, whether the detected value of the flowmeter 1212 indicates the flow rate set value (in an allowable range) within a predetermined period or not, as a result of the flow rate control by the flowmeter 1212 and the flow rate control valve 1211 with respect to the flow rate set value set in the control device 110. When the flowmeter is normal, transitioning to Step S120A, the control of the flow rate (S15 and S21 in FIG. 4) is executed based on the detected value of the flowmeter 1212 as described above. Meanwhile, when the flowmeter is not normal, transitioning to Step 120B, the control of the flow rate (S15 and S21 in FIG. 4) is executed based on the detected value of the pressure gauges 142 and 153. In the control based on the detected value of the pressure gauges 142 and 153, the control device 110 sets a fluid pressure set value, and the feedback control is performed on the flow rate control valve 1211 so that the detected value of the pressure gauges 142 and 153 approaches the fluid pressure set value.

The flow rate control based on the pressure gauge may be mainly performed, and the control may be switched to the flow rate control based on the flowmeter when the abnormality is detected in the pressure gauge.

Third Embodiment

Figure 14:
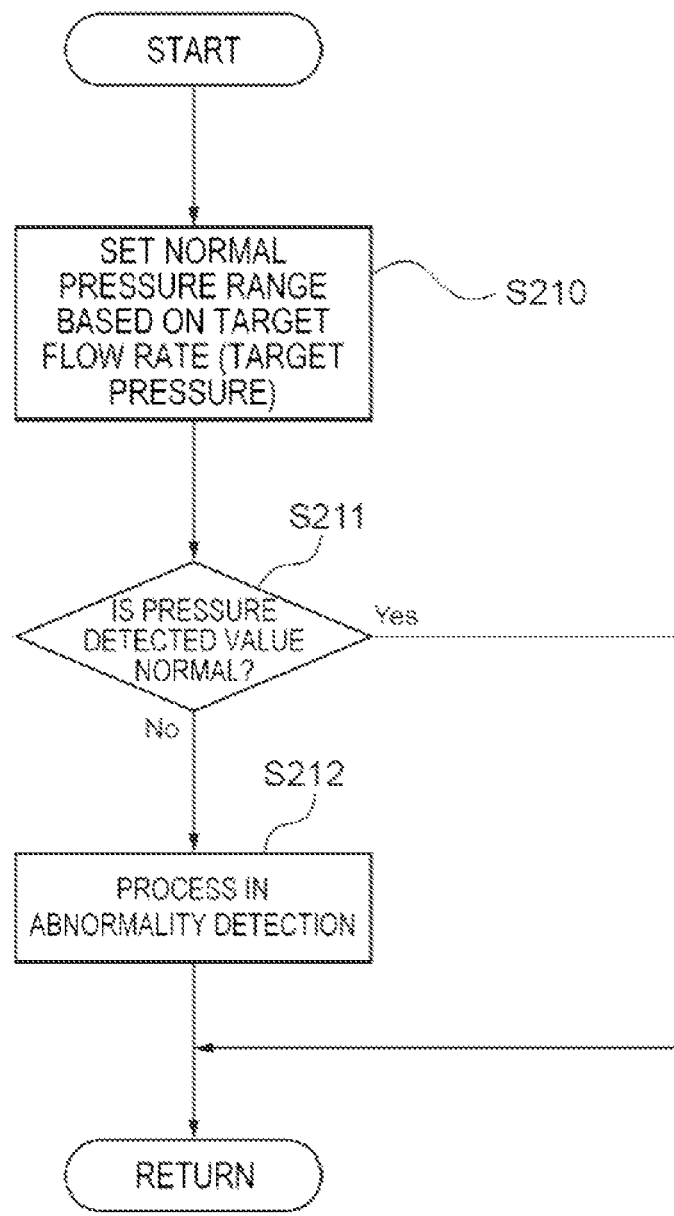
FIG. 14 is a flowchart of an abnormality detection control using a pressure gauge.

FIG. 14 is a flowchart of an abnormality detection control using the pressure gauge. This control flow is also executed in parallel with the control flow in FIG. 4. In Step S210, a normal range as the detected value of the pressure gauges 142 and 153 is set based on the flow rate set value or the fluid pressure set value set by the control device 110. For the normal range, for example, an experiment or the like is preliminarily performed, and a table of the normal range corresponding to the flow rate set value or the fluid pressure set value has been made. It may be a fixed error range regardless of the flow rate set value and the fluid pressure set value. In Step S211, it is determined whether an actual detected value detected in the pressure gauges 142 and 153 is in the set normal range or not. When the detected value of the pressure gauges 142 and 153 is in the normal range, the process from Step S210 is repeated. Meanwhile, when the detected value of the pressure gauges 142 and 153 is out of the normal range, transitioning to Step S212, it is determined that the configuration on the secondary side of the pressure gauges 142 and 153 is abnormal, thus executing a process in abnormality detection. The process in abnormality detection includes output of alarm to a user or another device, stop of the device, and the like. The abnormality in the configuration on the secondary side includes a case where there is an abnormality such as leakage in the pipes 85, 95, and 96 and the like on the secondary side of the pressure gauges 142 and 153, a case where exact nozzles are not mounted as the nozzles 211 and 212, and the like. When a valve is mounted on the pipe on the secondary side of the pressure gauge, a case where the valve is abnormal can also detected as the abnormality on the secondary side.

With this embodiment, the abnormality in the pipe (for example, leakage of the pipe) on downstream of the flow rate control valve and the abnormality in the device (for example, the nozzle and the valve) connected to the pipe can be promptly detected based on the detected value of the pressure gauge.

(Operational Advantage)

With the above-described embodiments, the chemical liquid are introduced from the identical chemical liquid supply source 20 to the first chemical liquid dilution box 120 and the second chemical liquid dilution box 130 to allow the first chemical liquid dilution box 120 and the second chemical liquid dilution box 130 to each control the flow rate and the concentration of the chemical liquid. Accordingly, the flow rates and the concentrations of the chemical liquid (the chemical liquid after dilution) supplied to the respective surfaces (the upper surface and the lower surface) of the substrate can be independently controlled.

The configuration where the first chemical liquid dilution box 120 and the second chemical liquid dilution box 130 each output the chemical liquid (the chemical liquid after dilution) can stop the output of the chemical liquid (the chemical liquid after dilution) from any of the first chemical liquid dilution box 120 and the second chemical liquid dilution box 130 by opening and closing the suck back valve unit 141, the open/close valve 151, and the open/close valve 152. The opening and closing of the open/close valve 151 and the open/close valve 152 can stop any of the chemical liquid (the chemical liquid after dilution) supplied to the nozzle 212 of the cleaning device 200 and the waiting portion 230 in the cleaning portion 210. Accordingly, the control in the cleaning liquid supply device 100 can supply only any of the respective surfaces (the upper surface and the lower surface) of the substrate and the waiting portion with the chemical liquid (the chemical liquid after dilution). Therefore, it is not necessary to install an additional valve and the like in the cleaning device 200 to supply only any of the respective surfaces (the upper surface and the lower surface) of the substrate and the waiting portion with the chemical liquid (the chemical liquid after dilution).

The first chemical liquid dilution box 120 and the second chemical liquid dilution box 130 can control the respective flow rates of the chemical liquid (the chemical liquid after dilution). Thus, it is not necessary to adjust the flow rate using the throttle as in the case where the chemical liquid (the chemical liquid after dilution) are branched from a common flow passage. Therefore, the pressure loss of the chemical liquid and the dilution water receiving in the flow passages of the cleaning liquid supply device 100 and the cleaning device 200 is reduced to ensure suppression or prevention of the reduction in the flow rate of the chemical liquid (the chemical liquid after dilution) to the cleaning device 200. For example, even when supply pressures of the chemical liquid and/or the dilution water to the cleaning liquid supply device 100 are low, the reduction in the flow rate of the chemical liquid (the chemical liquid after dilution) supplied to the respective surfaces (the upper surface and the lower surface) of the substrate can be suppressed or prevented.

With the above-described embodiments, the use of the CLCs 121, 122, 131, and 132 including the flowmeter 1212 and the flow rate control valve 1211 ensures simple and precise control of the flow rates of the chemical liquid and/or the dilution water by the signal from the control device 110. For example, compared with the case where the flow rates of the chemical liquid to the respective surfaces (the upper surface and the lower surface) of the substrate are controlled by the throttle, the pressure loss in the flowmeter 1212 and the flow rate control valve 1211 can be reduced. Compared with the case where the degree of opening of the throttle (for example, the needle valve) is manually adjusted, the CLCs 121, 122, 131, and 132 including the flowmeter 1212 and the flow rate control valve 1211 have an advantage in that the flow rate can be automatically controlled.

With the above-described embodiments, the use of the ultrasonic flowmeter can reduce the pressure loss in the flowmeter compared with the case where the differential pressure flowmeter (the orifice flowmeter) is used. In this configuration, the pressure loss in the flow passage can be reduced to suppress the reduction in the flow rate that can be supplied to the substrate, thus having an advantage especially when the supply pressures of the chemical liquid and/or the dilution water to the cleaning liquid supply device 100 are low.

With the above-described embodiments, changing the degree of opening of the valve body 1211a with the driving source 1211b including the motor ensures quick and precise adjustment of the degree of opening of the flow rate control valve.

With the above-described embodiments, the suck back valve unit 141 can distribute/stop the output of the chemical liquid after dilution from the first chemical liquid dilution box 120. The suck back valve unit 141 can reduce or prevent the dripping from the nozzle 211 when the output from the first chemical liquid dilution box 120 is cut off.

With the above-described embodiments, supplying the substrate on the waiting portion 230 that waits the cleaning with the chemical liquid (the chemical liquid after dilution) from the second chemical liquid dilution box 130, which supplies any surface (for example, the lower surface) of the respective surfaces of the substrate with the chemical liquid (the chemical liquid after dilution), can omit an additional configuration for supplying the waiting substrate with the chemical liquid (the chemical liquid after dilution), thus ensuring a simplified configuration of the fluid circuit.

From the description of the above-described embodiments, at least the following technical ideas can be obtained.

According to a first aspect, a cleaning liquid supply device for supplying a cleaning device with chemical liquid for cleaning is provided. This cleaning liquid supply device includes a chemical liquid inlet portion and a dilution water inlet portion, a first chemical liquid control unit fluidically connected to the chemical liquid inlet portion and the dilution water inlet portion, and a second chemical liquid control unit fluidically connected to the chemical liquid inlet portion and the dilution water inlet portion. The first chemical liquid control unit includes a first chemical-liquid-flow-rate control unit configured to receive a supply of chemical liquid from the chemical liquid inlet portion to control a flow rate of the chemical liquid, a first dilution-water-flow-rate control unit configured to receive a supply of a dilution water from the dilution water inlet portion to control a flow rate of the dilution water, and a first mixing portion that mixes the chemical liquid and the dilution water from the first chemical-liquid-flow-rate control unit and the first dilution-water-flow-rate control unit. The second chemical liquid control unit includes a second chemical-liquid-flow-rate control unit configured to receive a supply of the chemical liquid from the chemical liquid inlet portion to control a flow rate of the chemical liquid, a second dilution-water-flow-rate control unit configured to receive a supply of the dilution water from the dilution water inlet portion to control a flow rate of the dilution water, and a second mixing portion configured to mix the chemical liquid and the dilution water from the second chemical-liquid-flow-rate control unit and the second dilution-water-flow-rate control unit.

With this aspect, the chemical liquid from an identical chemical liquid supply source are diluted independently in the first and second chemical liquid control units to ensure independent control of the flow rates and the concentrations of the chemical liquid. For example, the flow rates and the concentrations of the chemical liquid supplied to the respective surfaces of the substrate can be independently controlled.

The configuration where the chemical liquid are output from the respective first and second chemical liquid control units can stop the output of the chemical liquid from any of the first and second chemical liquid control units by disposing a valve in the first and second chemical liquid control units or related to the first and second chemical liquid control units. Accordingly, the control in the cleaning liquid supply device ensures the supply of the chemical liquid to only any one of the upper surface or the lower surface of the substrate. Therefore, it is not necessary to install an additional valve and the like in the cleaning device to supply only any one of the first surface and the second surface of the substrate with the chemical liquid.

The first and second chemical liquid control units can control the respective flow rates of the chemical liquid. Thus, it is not necessary to adjust the flow rate using the throttle as in the case where the chemical liquid are branched from the common flow passage to the respective surface sides of the substrate. Therefore, the pressure loss of the chemical liquid and the dilution water receiving in the flow passages of the cleaning liquid supply device and the cleaning device is reduced to ensure the suppression or the prevention of the reduction in the flow rate of the chemical liquid to the cleaning device. For example, even when the supply pressures (input pressures) of the chemical liquid and/or the dilution water to the cleaning liquid supply device are low, the reduction in the flow rates of the chemical liquid supplied to the respective surfaces of the substrate can be suppressed or prevented.

According to a second aspect, in the cleaning liquid supply device of the first aspect, the first and second chemical-liquid-flow-rate control units and the first and second dilution-water-flow-rate control units each include a flowmeter configured to detect the flow rate of the chemical liquid or the dilution water and a flow rate control valve configured to perform a feedback control on the flow rate of the chemical liquid or the dilution water based on a detected value of the flowmeter.

With this aspect, the use of the flow rate control unit including the flowmeter and the flow rate control valve ensures the simple and precise control of the flow rates of the chemical liquid and/or the dilution water by the signal from the control unit such as a computer. For example, compared with the case where the flow rates of the chemical liquid to the respective surface sides of the substrate are controlled by the throttle, the pressure loss in the flow passage can be reduced. Compared with the case where the degree of opening of the throttle is manually adjusted, the flow rate control unit including the flowmeter and the flow rate control valve has an advantage in that the flow rate can be automatically controlled.

According to a third aspect, in the cleaning liquid supply device of the second aspect, at least one of the first and second chemical-liquid-flow-rate control units and the first and second dilution-water-flow-rate control units includes an ultrasonic flowmeter as the flowmeter.

With this aspect, the use of the ultrasonic flowmeter can reduce the pressure loss in the flowmeter compared with the case where the differential pressure flowmeter (the orifice flowmeter) is used. In this configuration, the pressure loss in the flow passage can be reduced to suppress the reduction in the flow rate that can be supplied to the substrate, thus having an advantage especially when the supply pressures of the chemical liquid and/or the dilution water to the cleaning liquid supply device are low.

According to a fourth aspect, in the cleaning liquid supply device of the second or third aspect, in at least one of the first and second chemical-liquid-flow-rate control units and the first and second dilution-water-flow-rate control units, the flow rate control valve is a motor valve whose degree of opening is changed by a motor.

With this aspect, changing the degree of opening of the flow rate control valve with the motor ensures the quick and precise adjustment of the degree of opening of the flow rate control valve.

According to a fifth aspect, in the cleaning liquid supply device of any of the first to fourth aspects, the first chemical liquid control unit further includes a suck back valve unit on a downstream side of the first mixing portion.

With this aspect, the suck back valve unit can distribute/stop the output of the chemical liquid after dilution from the first chemical liquid control unit. The suck back valve unit can reduce or prevent the dripping from the nozzle when the output from the first chemical liquid control unit is cut off.

According to a sixth aspect, a cleaning unit is provided. This cleaning unit includes the cleaning liquid supply device of any of the first to fifth aspects, and the cleaning device connected to the cleaning liquid supply device. The first and second chemical liquid control units are configured to supply each of a first surface and a second surface of an identical substrate installed in the cleaning device with the chemical liquid after dilution.

With this aspect, the chemical liquid from the identical chemical liquid supply source are introduced to the first and second chemical liquid control units, and respective chemical liquid having the flow rates and the concentrations controlled independently in the first and second chemical liquid control units are supplied to the first surface and the second surface of the substrate, thus ensuring the independent control of the flow rates and the concentrations of the chemical liquid supplied to the first surface and the second surface of the substrate.

The configuration where the chemical liquid are output from the respective first and second chemical liquid control units can stop the output of the chemical liquid from any of the first and second chemical liquid control units by disposing the valve in the first and second chemical liquid control units or related to the first and second chemical liquid control units. Accordingly, the control in the cleaning liquid supply device ensures the supply of the chemical liquid to only any one of the first surface and the second surface of the substrate. Therefore, it is not necessary to install an additional valve and the like in the cleaning device to supply only any one of the first surface and the second surface of the substrate with the chemical liquid.

The first and second chemical liquid control units can control the respective flow rates of the chemical liquid. Thus, it is not necessary to adjust the flow rate using the throttle as in the case where the chemical liquid are branched from the common flow passage to sides of the first surface and the second surface of the substrate. Therefore, the pressure loss of the chemical liquid and the dilution water receiving in the flow passages of the cleaning liquid supply device and the cleaning device is reduced to ensure the suppression or the prevention of the reduction in the flow rate of the chemical liquid to the cleaning device. For example, even when the supply pressures of the chemical liquid and/or the dilution water to the cleaning liquid supply device are low, the reduction in the flow rates of the chemical liquid supplied to the first surface and the second surface of the substrate can be suppressed or prevented.

According to a seventh aspect, in the cleaning unit of the sixth aspect, the second chemical liquid control unit is further configured to supply a substrate waiting or ready for cleaning in the cleaning device with the chemical liquid after dilution.

Supplying the substrate that waits the cleaning with the chemical liquid from the second chemical liquid control unit, which supplies the lower surface of the substrate with the chemical liquid, can omit an additional configuration for supplying the waiting substrate with the chemical liquid, thus ensuring the simplified configuration of the fluid circuit.

According to an eighth aspect, a storage medium that stores a program to cause a computer to execute a method for controlling a cleaning unit is provided. The program causes the computer to execute receiving a supply of chemical liquid from a chemical liquid inlet portion to control flow rates of the chemical liquid independently by first and second chemical-liquid-flow-rate control units, receiving a supply of a dilution water from a dilution water inlet portion to control flow rates of the dilution water independently by first and second dilution-water-flow-rate control units, mixing the chemical liquid and the dilution water having the flow rates controlled by the first chemical-liquid-flow-rate control unit and the first dilution-water-flow-rate control unit in a first mixing portion to output the chemical liquid after dilution to the cleaning device, and mixing the chemical liquid and the dilution water having the flow rates controlled by the second chemical-liquid-flow-rate control unit and the second dilution-water-flow-rate control unit in a second mixing portion to output the chemical liquid after dilution to the cleaning device.

With this aspect, the chemical liquid from the identical chemical liquid supply source are diluted independently in the first and second chemical liquid control units to ensure the independent control of the flow rates and the concentrations of the chemical liquid.

The configuration where the chemical liquid (the chemical liquid after dilution) are output from the respective first and second chemical liquid control units can stop the output of the chemical liquid from any of the first and second chemical liquid control units.

The first and second chemical liquid control units can control the respective flow rates of the chemical liquid. Thus, it is not necessary to adjust the flow rate using the throttle as in the case where the chemical liquid are branched from the common flow passage. Therefore, the pressure loss of the chemical liquid and the dilution water receiving in the flow passages of the cleaning liquid supply device and the cleaning device is reduced to ensure the suppression or the prevention of the reduction in the flow rate of the chemical liquid to the cleaning device.

According to a ninth aspect, in the storage medium of the eighth aspect, the program further causing the computer to execute supplying a first surface and a second surface of an identical substrate with the chemical liquid after dilution from the first and second mixing portions is stored. The flow rates and the concentrations of the chemical liquid supplied to the first surface and the second surface of the substrate can be independently controlled. The control in the cleaning liquid supply device ensures the supply of the chemical liquid to only any one of the first surface or the second surface of the substrate. Therefore, it is not necessary to install an additional valve and the like in the cleaning device to supply only any one of the first surface or the second surface of the substrate with the chemical liquid. Even when the supply pressures of the chemical liquid and/or the dilution water to the cleaning liquid supply device are low, the reduction in the flow rate of the chemical liquid supplied to the first surface or the second surface of the substrate can be suppressed or prevented.

According to a tenth aspect, a cleaning liquid supply device for supplying a cleaning device with chemical liquid for cleaning is provided. This cleaning liquid supply device includes a flowmeter, a first pipe that enters into the flowmeter, and a second pipe that exits from the flowmeter. The first pipe and the second pipe are inclined from a horizontal direction and a vertical direction.

With this configuration, neither the first pipe nor the second pipe is arranged along the horizontal direction, thus ensuring the reduction in the remaining of the air (the air bubbles) in the pipe. Both of the first pipe and the second pipe are inclined from the vertical direction, thus ensuring the reduction in the pressure loss of the flow passage.

According to an eleventh aspect, in the cleaning liquid supply device of the tenth aspect, the first pipe and the second pipe are arranged inclined with an identical gradient.

With this aspect, the installation of the first and second pipes is simple.

According to a twelfth aspect, in the cleaning liquid supply device of the tenth or eleventh aspect, the flowmeter is arranged inclined.

With this aspect, the flow passage in the flowmeter and the flow passage formed of the first and second pipes can be inclined.

According to a thirteenth aspect, in the cleaning liquid supply device of any of the tenth to twelfth aspects, at least one of the first pipe and the second pipe is connected to a pipe extending in the horizontal direction, and the pipe extending in the horizontal direction is curved to approach a direction that at least one of the first pipe and the second pipe extends on a side connected to at least one of the first pipe and the second pipe.

In this configuration, the pipe extending in the horizontal direction can be curved to be connected to the first pipe and/or the second pipe extending with being inclined. When the pipe extending in the horizontal direction is connected to the pipe extending in the vertical direction, the connection is performed via a joint in many cases since its directional change is large. With the configuration of this aspect, the first pipe and the second pipe are arranged inclined. Thus, gently curving the pipe extending in the horizontal direction ensures the connection to the first pipe and/or the second pipe. The first pipe and/or the second pipe may be connected to the pipe extending in the horizontal direction via a valve.

According to a fourteenth aspect, in the cleaning liquid supply device of any of the tenth to twelfth aspects, at least one of the first pipe and the second pipe is connected to a pipe extending in the vertical direction, and the pipe extending in the vertical direction is curved to approach a direction that at least one of the first pipe and the second pipe extends on a side connected to at least one of the first pipe and the second pipe.

In this configuration, the pipe extending in the vertical direction can be curved to be connected to the first pipe and/or the second pipe extending with being inclined. When the pipe extending in the vertical direction is connected to the pipe extending in the horizontal direction, the connection is performed via a joint in many cases since its directional change is large. With the configuration of this aspect, the first pipe and the second pipe are arranged inclined. Thus, gently curving the pipe extending in the vertical direction ensures the connection to the first pipe and/or the second pipe. The first pipe and/or the second pipe may be connected to the pipe extending in the vertical direction via a valve.

According to a fifteenth aspect, in the cleaning liquid supply device of any of the tenth to fourteenth aspects, at least one of the first pipe and the second pipe has a bent portion on an opposite side of the flowmeter, and respective piping parts on both sides of the bent portion are inclined from the horizontal direction and the vertical direction.

With this aspect, even when the first and/or second pipe has the bent portion, the respective piping parts on both sides of the bent portion are inclined, thus ensuring the reduction in the remaining of the air (the air bubbles) in the pipe. In the bent portion, the direction of the pipe is changed to have a tendency that the air is likely to remain, but inclining the respective piping parts on both sides of the bent portion from the horizontal direction and the vertical direction ensures the reduction in the remaining of the air (the air bubbles) in the bent portion.

According to a sixteenth aspect, in the cleaning liquid supply device of any of the tenth to fifteenth aspects, the flowmeter is an ultrasonic flowmeter.

As described above, arranging the first and second pipes inclined ensures the reduction in the remaining of the air bubbles in these pipes and at the boundary, thus improving the detection accuracy of the flow rate with the ultrasonic flowmeter.

It is thought that the reduction in the remaining of the air bubbles in the pipe also has an effect to reduce the drift (the bias of the flow rate) of the fluid flowing through the pipe. Thus, it is thought that, also when the differential pressure flowmeter is used, the detection accuracy of the flow rate can be improved.

According to a seventeenth aspect, in the cleaning liquid supply device of any of the tenth to sixteenth aspects, at least one of the first pipe and the second pipe is inclined from the vertical direction with an inclination angle of 10 degrees or more and 40 degrees or less.

Setting the angle of the inclination from the vertical direction to 10 degrees or more and 40 degrees or less ensures the reduction in the remaining of the air bubbles and the reduction in the pressure loss of the fluid in the pipe at the same time. When the angle of the inclination is less than 10 degrees, the pressure loss in the pipe is large. Meanwhile, when the angle of the inclination is more than 40 degrees, the effect of the reduction in the remaining of the air bubbles is small. Even if it is out of this angle range, although the effect of the reduction in the pressure loss or the effect of the reduction in the remaining of the air bubbles is small, a certain effect can be obtained by inclining the first pipe and the second pipe from the horizontal and vertical directions.

According to an eighteenth aspect, in the cleaning liquid supply device of any of the tenth to seventeenth aspects, a flow rate control valve and a pressure gauge arranged on a flow passage on an output side of the flow rate control valve are further included. In this aspect, the use of the detected value of the pressure gauge can perform the flow rate control, the abnormality detection, and the like of the cleaning liquid supply device.

According to a nineteenth aspect, in the cleaning liquid supply device described in the eighteenth aspect, the flow rate control valve is configured to control a flow rate based on a detected value of the flowmeter and is configured to control a flow rate based on a detected value of the pressure gauge.

For example, when the flow rate control valve is controlled based on the detected value of the flowmeter and the abnormality is detected in the flowmeter, the flow rate control valve can be controlled based on the detected value of the pressure gauge. Its contrary using method is also possible. For example, the pressure gauge can be used as a backup of the flowmeter.

According to a twentieth aspect, in the cleaning liquid supply device described in the eighteenth or nineteenth aspect, an abnormality detection of at least one of a pipe on the output side of the flow rate control valve and a device connected to the pipe is performed based on a detected value of the pressure gauge.

The abnormality in the pipe (for example, the leakage of the pipe) on downstream of the flow rate control valve and the abnormality in the device (for example, the nozzle and the valve) connected to the pipe can be detected based on the detected value of the pressure gauge.

According to a twenty-first aspect, a cleaning unit includes the cleaning liquid supply device of any of the tenth to twentieth aspects and the cleaning device connected to the cleaning liquid supply device.

With this aspect, in the cleaning unit, the operational advantage of the above-described aspects can be provided. This results in an accurate control of the flow rate of the chemical liquid supplied to the cleaning device. In one example, even when the abnormality occurs in one of the flowmeter and the pressure gauge, the flow rate control with the flow rate control valve can be continued using the other sensor. Also, in one example, use of a pressure sensor can perform the abnormality detection of the pipe, the nozzle, the valve, and the like.

The embodiments of the present invention have been described above based on some examples in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

The present application claims priority from Japanese Patent Application No. 2016-244469 filed on Dec. 16, 2016 and Japanese Patent Application No. 2017-236998 filed on Dec. 11, 2017. The entire disclosure including the descriptions, the claims, the drawings, and the abstracts in Japanese Patent Application No. 2016-244469 filed on Dec. 16, 2016 and Japanese Patent Application No. 2017-236998 filed on Dec. 11, 2017 is herein incorporated by reference.

The entire disclosure including the descriptions, the claims, the drawings, and the abstracts in Japanese Unexamined Patent Application Publication No. 9-260332 (Patent Literature 1), Japanese Unexamined Patent Application Publication No. 2014-132641 (Patent Literature 2), Japanese Unexamined Patent Application Publication No. 2016-9818 (Patent Literature 3), and Japanese Unexamined Patent Application Publication No. 2016-15469 (Patent Literature 4) is herein incorporated by reference.

REFERENCE SIGNS LIST 1 polishing device
2 housing
3 load port
4a to 4d polishing unit
5a, 5b cleaning unit
6 drying unit
7 first transport robot
8 transport unit
9a second transport robot
9b third transport robot
10 cleaning unit
20 chemical liquid supply source
30 DIW supply source
50 chemical liquid utility box
51 input portion
52 open/close valve
53 lockout valve
54 pressure gauge
60 regulator
61 input portion
80 to 86, 90 to 96 pipe
100 cleaning liquid supply device
101 case
120 first chemical liquid dilution box
121 first chemical liquid CLC
122 first DIW CLC
130 second chemical liquid dilution box
131 second chemical liquid CLC
132 second DIW CLC
141 suck back valve unit
142 pressure gauge
200 cleaning device
210 cleaning portion
211 nozzle
212 nozzle
230 waiting portion
300 control device
1211 flow rate control valve
1211a valve body
1211b driving source
1212 flowmeter
1213 control unit

What is claimed:

1. A device for supplying a cleaning device with chemical liquid for cleaning, the device comprising:
a flowmeter;
a first pipe that enters into the flowmeter; and
a second pipe that exits from the flowmeter,
a base to which the flowmeter, the first pipe and the second pipe are attached; and
a chassis accommodating the flowmeter, the first pipe, the second pipe and the base,
wherein the base is secured to a side surface and a bottom surface of the chassis to be inclined from a horizontal direction and a vertical direction, and wherein the first pipe and the second pipe are inclined from a horizontal direction and a vertical direction
wherein the base comprises:
a first base to which the flowmeter, the first pipe and the second pipe are attached;
a second base attached to one end of the first base and secured to the bottom surface of the chassis; and
a third base attached to the other end of the first base and secured to the side surface of the chassis, wherein the first base is inclined from the horizontal direction and the vertical direction.

2. The device according to claim 1, wherein
the first pipe and the second pipe are arranged inclined with an identical gradient.

3. The device according to claim 1, wherein
the flowmeter is arranged inclined.

4. The device according to claim 1, wherein
at least one of the first pipe and the second pipe is connected to a pipe extending in the horizontal direction, and the pipe extending in the horizontal direction is curved to approach a direction that at least one of the first pipe and the second pipe extends on a side connected to at least one of the first pipe and the second pipe.

5. The device according to claim 1, wherein
at least one of the first pipe and the second pipe is connected to a pipe extending in the vertical direction, and the pipe extending in the vertical direction is curved to approach a direction that at least one of the first pipe and the second pipe extends on a side connected to at least one of the first pipe and the second pipe.

6. The device according to claim 1, wherein
at least one of the first pipe and the second pipe has a bent portion on an opposite side of the flowmeter, and respective piping parts on both sides of the bent portion are inclined from the horizontal direction and the vertical direction.

7. The device according to claim 1, wherein
the flowmeter is an ultrasonic flowmeter.

8. The device according to claim 1, wherein
at least one of the first pipe and the second pipe is inclined from the vertical direction with an inclination angle of 10 degrees or more and 40 degrees or less.

9. The device according to claim 1 further comprising:
a flow rate control valve; and
a pressure gauge arranged on a flow passage on an output side of the flow rate control valve.

10. The device according to claim 9, wherein
the flow rate control valve is configured to control a flow rate based on a detected value of the flowmeter and is configured to control a flow rate based on a detected value of the pressure gauge.

11. The device according to claim 9, wherein
an abnormality detection of at least one of a pipe on the output side of the flow rate control valve and a device connected to the pipe is performed based on a detected value of the pressure gauge.

12. A cleaning unit comprising:
the device according to claim 6; and
the cleaning device connected to the device according to claim 6.

* * * * *